United States Patent
Choi et al.

(10) Patent No.: US 12,368,045 B2
(45) Date of Patent: Jul. 22, 2025

(54) DISPLAY PANEL, TILED DISPLAY DEVICE INCLUDING THE SAME, AND METHOD OF MANUFACTURING DISPLAY PANEL

(71) Applicant: Samsung Display Co., Ltd., Yongin-Si (KR)

(72) Inventors: Nak Cho Choi, Yongin-si (KR); Sang Woo An, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 500 days.

(21) Appl. No.: 17/852,183

(22) Filed: Jun. 28, 2022

(65) Prior Publication Data

US 2023/0207318 A1 Jun. 29, 2023

(30) Foreign Application Priority Data

Dec. 23, 2021 (KR) .......................... 10-2021-0186368

(51) Int. Cl.
  *H01L 21/027* (2006.01)
  *G09F 9/302* (2006.01)
  *H10K 59/122* (2023.01)

(52) U.S. Cl.
  CPC ........ *H01L 21/0273* (2013.01); *G09F 9/3026* (2013.01); *H10K 59/122* (2023.02)

(58) Field of Classification Search
  None
  See application file for complete search history.

(56) References Cited

U.S. PATENT DOCUMENTS

| 9,818,725 | B2 | 11/2017 | Bower et al. | |
|---|---|---|---|---|
| 9,911,722 | B2 | 3/2018 | Higginson et al. | |
| 2006/0160348 | A1* | 7/2006 | Pu | H01L 24/13 257/E23.021 |
| 2007/0120270 | A1* | 5/2007 | Kuroda | H01L 24/81 257/E21.511 |
| 2010/0041252 | A1* | 2/2010 | Mizukami | H01R 12/737 29/874 |
| 2012/0256199 | A1* | 10/2012 | Lee | G02F 1/13452 438/34 |
| 2023/0207318 | A1* | 6/2023 | Choi | G09F 9/3026 430/311 |

(Continued)

FOREIGN PATENT DOCUMENTS

| CN | 119342896 A | * | 1/2025 |
|---|---|---|---|
| KR | 10-1462845 B1 | | 11/2014 |

(Continued)

*Primary Examiner* — Michael Lebentritt
(74) *Attorney, Agent, or Firm* — Innovation Counsel LLP

(57) ABSTRACT

A display panel manufacturing method includes the following steps: providing a first signal pad on a first face of a substrate; providing a second signal pad on a second face of the substrate; providing a conductive member that contacts each of the first signal pad, the second signal pad, and a third face of the substrate; providing a photoresist pattern that partially covers the conductive member and overlaps each of the first signal pad, the second signal pad, and the third face of the substrate; pre-curing the photoresist member; forming a signal line by etching the conductive member; and curing the photoresist member to form a cured photoresist member. The cured photoresist member covers an edge of the signal line.

20 Claims, 15 Drawing Sheets

(56) References Cited

U.S. PATENT DOCUMENTS

2023/0268353 A1* 8/2023 Tsai .................. H02J 50/05
                                                              345/174

FOREIGN PATENT DOCUMENTS

| KR | 10-1595696 B1 | 2/2016 |
| KR | 10-2020-0062635 A | 6/2020 |
| KR | 10-2179672 B1 | 11/2020 |
| WO | WO-2024026914 A1 * | 2/2024 |

* cited by examiner

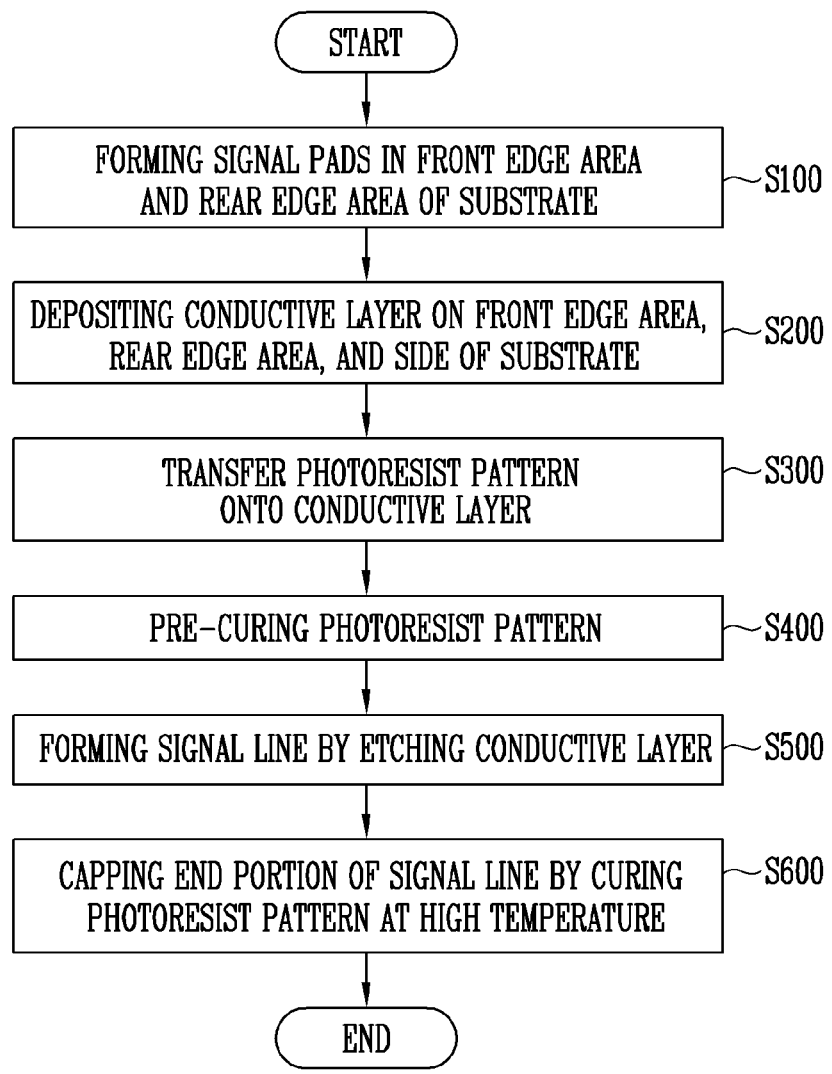

DISPLAY PANEL, TILED DISPLAY DEVICE INCLUDING THE SAME, AND METHOD OF MANUFACTURING DISPLAY PANEL

CROSS-REFERENCE TO RELATED APPLICATION

The present application claims priority under 35 U.S.C. § 119(a) to Korean Patent Application No. 10-2021-0186368 filed on Dec. 23, 2021 in the Korean Intellectual Property Office; the Korean Patent Application is incorporated by reference.

BACKGROUND

1. Technical Field

The technical field is related to a display panel, a tiled display device including the display panel, and a method for manufacturing a display panel.

2. Related Art

A display device may include a display panel for displaying images in response to input signals. A tiled display device may include member display devices that are connected to each other to jointly display combined, large images. The member display device may be fixed to a mounting frame.

SUMMARY

Embodiments may be related to a method for manufacturing a display panel. In the method, a conductive layer is formed on a side surface of a substrate, a photoresist pattern is transferred from a mold onto the conductive layer to partially cover the conductive layer, the partially covered conductive layer is etched to form signal lines, and remaining portions of the photoresist pattern are cured to substantially/completely cover the signal lines.

Embodiments may be related to a display panel including an insulating pattern covering signal lines that are disposed on a side of a substrate. The signal lines electrically connect signal pads that are disposed on opposite faces of the substrate.

Embodiments may be related to a tiled display device that includes multiple display panels.

In accordance with an embodiment, a method of manufacturing a display panel may include the following steps: forming signal pads in a front edge area and a rear edge area of a substrate; depositing a conductive layer on the front edge area of the substrate, the rear edge area of the substrate, and a side of the substrate, which connects the front edge area and the rear edge area to each other; transferring a photoresist pattern covering a portion of the conductive layer in the form of a line pattern onto the front edge area, the rear edge area, and the side of the substrate; pre-curing the photoresist pattern; forming a signal line covered by the photoresist pattern by etching the conductive layer; and capping an end portion of the signal line by curing the photoresist pattern at a high temperature.

The conductive layer may be in contact with the top of a first signal pad of the front edge area and the bottom of a second signal pad of the rear edge area.

The photoresist pattern may cover all of the signal line, the first signal pad, and the second signal pad.

The photoresist pattern may include a photoresist and a black pigment.

The black pigment may include at least one of carbon black and titanium black.

In the forming of the signal line, the conductive layer may be wet-etched to be undercut with respect to the photoresist pattern.

The conductive layer may be integrally formed with the front edge area, the rear edge area, and the side through a sputtering process.

The conductive layer may include copper and titanium.

The transferring of the photoresist pattern may include: transferring a photoresist onto a silicon mold; and forming the photoresist pattern by transferring the photoresist onto the front edge area, the rear edge area, and the side through a printing technique using the silicon mold.

The silicon mold may include a plurality of grooves into which the photoresist is transferred. The photoresist pattern may correspond to positions of the grooves.

The photoresist pattern may be reflowed by the curing at the high temperature to be in contact with the substrate.

A distance between the end portion of the signal line and one end portion of the photoresist, which covers the end portion of the signal line, may be 2 μm or more and 10 μm or less.

In accordance with an embodiment, a display panel may include the following elements: a substrate; pixels disposed on a front surface of a display area of the substrate; first signal pads disposed in a front edge area of the substrate and electrically connected to the pixels; second signal pads disposed in a rear edge area of the substrate; signal lines electrically connecting the first signal pads and the second signal pads respectively to each other through a side of the substrate; and insulating patterns covering the signal lines, the first signal pads, and the second signal pads, wherein the insulating patterns surround end portions of the signal lines, the first signal pads, and the second signal pads.

The insulating pattern may include a photoresist material and a black pigment, and exhibit black.

The black pigment may include at least one of carbon black and titanium black.

The insulating patterns may be disposed at the side of the substrate to be spaced apart from each other.

The insulating patterns may be in contact with the substrate.

In accordance an embodiment, a tiled display device may include the following elements: display panels arranged while sides of the display panels are in contact with each other, wherein each of the display panels includes: a substrate; pixels disposed on a front surface of a display area of the substrate; first signal pads disposed in a front edge area of the substrate and electrically connected to the pixels; second signal pads disposed in a rear edge area of the substrate; signal lines electrically connecting the first signal pads and the second signal pads respectively to each other through a side of the substrate; and insulating patterns covering the signal lines, the first signal pads, and the second signal pads, and wherein the insulating patterns surround end portions of the signal lines, the first signal pads, and the second signal pads.

The insulating pattern may include a photoresist material and a black pigment, and exhibits black.

The insulating patterns may be disposed at the side of the substrate to be spaced apart from each other, and be in contact with the substrate.

An embodiment may be related to a method for manufacturing a display panel. The method may include the following steps: providing a first signal pad on a first face of a substrate; providing a second signal pad on a second face of the substrate; providing a conductive member that contacts each of the first signal pad, the second signal pad, and a third face of the substrate, wherein the first signal pad and the second signal pad may be electrically connected through the conductive member to each other; providing a photoresist member that partially covers the conductive member and overlaps each of the first signal pad, the second signal pad, and the third face of the substrate; pre-curing the photoresist member; forming a signal line by etching the conductive member; and curing the photoresist member to form a cured photoresist member. The cured photoresist member may cover an edge of the signal line.

The first signal pad and the second signal pad may be positioned between two sections of the conductive member and may respectively directly contact the two sections of the conductive member.

The photoresist member may completely cover each of a face of the signal line, a face of the first signal pad, and a face of the second signal pad. The face of the signal line may overlap the third face of the substrate.

The photoresist member may include a photoresist and a black pigment.

The black pigment may include at least one of carbon black and titanium black.

In the forming of the signal line, the conductive member may be wet-etched to be undercut with respect to the photoresist member.

The conductive member may be integrally formed on the first face of the substrate, the second face of the substrate, and the third face of the substrate through a sputtering process.

The conductive member may include at least one of copper and titanium.

The providing of the photoresist member may include the following steps: providing a photoresist in a silicon mold; and transferring the photoresist from the silicon mode onto the first face of the substrate, the second face of the substrate, and the third face of the substrate through a printing process.

The silicon mold may include a groove. The photoresist may be provided inside the groove before being transferred onto the substrate. In the printing process, a position of the photoresist member may correspond to a position of the groove.

The photoresist member may be reflowed by the curing. The cured photoresist member may directly contact the substrate.

Both of the edge of the signal line and an edge of the cured photoresist member directly contact the substrate. A distance between the edge of the signal line and the edge of the photoresist may be 2 μm or more and 10 μm or less (i.e., in a range of 2 μm to 10 μm).

An embodiment may be related to a display panel. The display panel may include the following elements: a substrate; a pixel disposed on a first face of the substrate; a first signal pad disposed on the first face of the substrate, disposed between the pixel and an edge of the first face of the substrate, and electrically connected to the pixel; a second signal pad disposed on a second face of the substrate; a signal line disposed on at least a third face of the substrate and electrically connecting the first signal pad and the second signal pad to each other; and an insulating member (completely) covering each of a face of the signal line, a face of the first signal pad, and a face of the second signal pad.

The insulating member may include a photoresist material and a black pigment.

The black pigment may include at least one of carbon black and titanium black.

The first signal pad and the second signal pad may be disposed between two sections of the signal line. The two sections of the signal line may be disposed between two sections of the insulating member.

The insulating member may directly contact each of the signal line and the substrate.

An embodiment may be related to a tiled display device. The tiled display device may include a first display panel and a second display panel that neighbor each other. The first display panel may include the following elements: a substrate; a pixel disposed on a first face of the substrate; a first signal pad disposed on the first face of the substrate, disposed between the pixel and an edge of the first face of the substrate, and electrically connected to the pixel; a second signal pad disposed on a second face of the substrate; a signal line disposed on at least a third face of the substrate, at least partially disposed between the third face of the substrate and the second display panel, and electrically connecting the first signal pad and the second signal pad to each other; and an insulating member at least partially disposed between the signal line and the second display panel and (substantially or completely) covering each of a face of the signal line, a face of the first signal pads, and a face of the second signal pad.

The insulating member may include a photoresist material and a black pigment.

The insulating member may directly contact each of the signal line and the substrate and may directly contact at least one of the first signal pad and the second signal pad.

Embodiments may avoid separately performing a photoresist process and an over-coating process for preventing contaminant infiltration, light reflection at a side line, and the like. Embodiment may not require a photoresist strip process. Advantageously, signal lines may be efficiently and effectively formed, a process yield of display panel manufacturing can be satisfactory, and the manufacturing cost for display panels can be minimized.

BRIEF DESCRIPTION OF THE DRAWINGS

FIG. 6 is a flowchart illustrating a method of manufacturing a display panel in accordance with embodiments.

DETAILED DESCRIPTION

Figure 1:
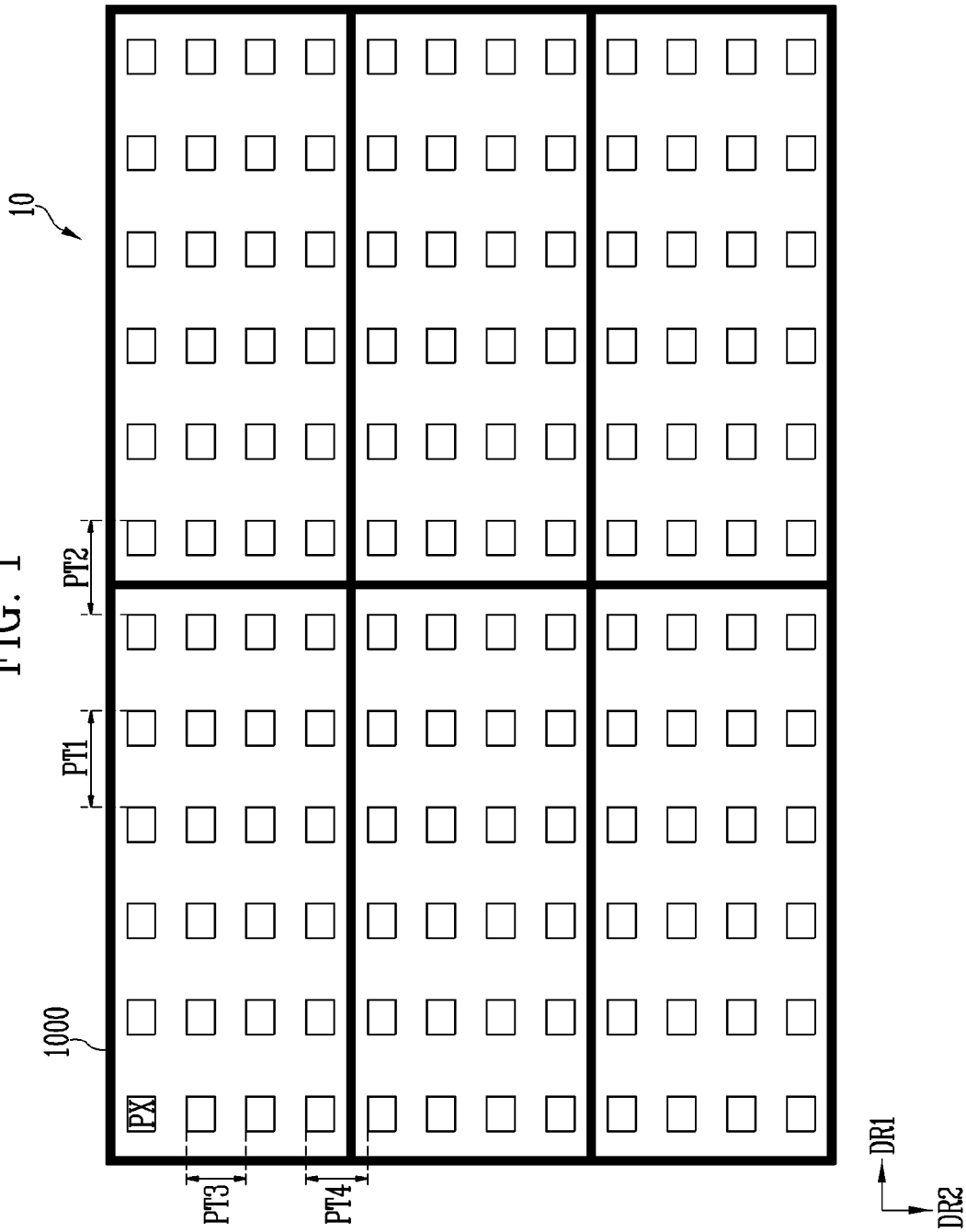
FIG. 1 is a plan view illustrating a tiled display device in accordance with embodiments.

Examples of embodiments are described with reference to the accompanying drawings. In the drawings, the same reference numerals may indicate the same elements or analogous elements.

The described embodiments are illustrative and may be modified or changed. Practical embodiments are not limited to the described embodiments.

Dimensions and/or shapes shown in the drawings may be exaggerated to help understanding.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" may mean "be made of." The term "adjacent" may mean "immediately adjacent." The expression that an element extends in a particular direction may mean that the element extends lengthwise in the particular direction and/or that the lengthwise direction of the element is in the particular direction. The term "pattern" may mean "member." The term "layer" may mean "member." The term "overlap" may be equivalent to "be overlapped by." A top face of a substrate may be a front face of the substrate when a display panel including the substrate is in use; a bottom face of the substrate may be a rear face of the substrate when the display panel is in use. A front face may be illustrated as a top face in the drawings; a rear face may be illustrated as a bottom face in the drawings. The term "end portion" may mean "edge."

FIG. 1 is a plan view illustrating a tiled display device 10 (or multi-panel display device 10) in accordance with embodiments.

Referring to FIG. 1, the tiled display device 10 may include a plurality of display panels 1000.

The tiled display device 10 may be formed by connecting two or more display panels 1000 to each other. The tiled display device 10 may include 2×3 display panels 1000 or a different arrangement and/or number of display panels 1000.

Each of the display panels 1000 may include pixels PX. The display panel 1000 may be connected to a driving circuit for driving the pixels PX. The driving circuit may serve as at least one of a scan driver, a data driver, and a timing controller. The driving circuit may be located at a rear of the display panel 1000.

The pixels PX may be disposed at a front of the display panel 1000 to form a light emitting surface. The pixels PX may constitute a plurality of pixel rows and a plurality of pixel columns. Each of the pixel rows may include pixels connected to the same scan line, and each of the pixel columns may include pixels connected to the same data line.

Each pixel PX may include sub-pixels for emitting lights of different colors. Each pixel PX may include first, second, and third sub-pixels respectively emitting lights of first, second, and third colors. For example, the first, second, and third colors may be red, green, and blue.

Immediately neighboring pixels PX in the display panel 1000 may be disposed at a substantially uniform first distance (e.g., a pitch) PT1 in a first direction DR1. A distance between closest pixels PX of adjacent display panels 1000 in the first direction DR1 may be a uniform second distance PT2. The first direction DR1 may be a lateral/horizontal direction, and a second direction DR2 may be a longitudinal/vertical direction.

The first distance PT1 and the second distance PT2 may be substantially equal to each other.

A distance between immediately neighboring pixels PX in the display panel 1000 in the second direction DR2 may be a uniform third distance PT3, and a distance between closest pixels PX of adjacent display panels 1000 in the second direction DR2 may be a uniform fourth distance PT4.

The third distance PT3 and the fourth distance PT4 may be substantially equal to each other.

The first to fourth distances PT1 to PT4 may be substantially equal to one another. Vertical distances and horizontal distances between all pixels PX included in the tiled display device 10 may be substantially uniform so as to improve the visibility of an image. Horizontal distances and/or vertical distances between adjacent pixels PX of adjacent display panels 1000 may be substantially equal.

Figure 2:
FIG. 2 is a cross-sectional view illustrating a display panel in accordance with embodiments.

FIG. 2 is a cross-sectional view schematically illustrating a display panel 1000 included in a tiled display device 10 in accordance with embodiments.

Referring to FIGS. 1 and 2, the display panel 1000 may include a substrate SUB, a pixel circuit layer PCL, and a display element layer DPL. The substrate SUB, the pixel circuit layer PCL, and the display element layer DPL may be sequentially stacked in a third direction DR3. The display panel 1000 may include a light control layer for controlling a color of light emitted from the display element layer DPL.

The substrate SUB may be made of an insulative material such as glass or resin. The substrate SUB may be made of a material having flexibility to be bendable or foldable, and may have a single-layered or multi-layered structure. The material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The substrate SUB may be a glass substrate. The substrate SUB may include silicon oxide or aluminum oxide as a main component.

The substrate SUB may include a display area and a non-display area. The display area may include pixels PX to display images in response to input signals. The non-display area may not include pixels PX and may not display images in response to input signals.

The pixel circuit layer PCL may be disposed on the substrate SUB. The pixel circuit layer PCL may include a pixel circuit configured to drive a light emitting element of each pixel PX. The pixel circuit layer PCL may include transistors and signal lines and/or power lines connected to the transistors. The pixel circuit PCL may have a stacked structure for forming the transistors.

The display element layer DPL may be disposed on the pixel circuit layer PCL. The display element layer DPL may include light emitting elements. The light emitting elements may be electrically connected to pixel circuits of the pixel circuit layer PCL.

Each of the light emitting elements may be an inorganic light emitting element including an inorganic light emitting material. Each of the light emitting elements may emit one of red light, green light, and blue light. The display element layer DPL may include an inorganic light emitting element emitting red light, an inorganic light emitting element emitting green light and an inorganic light emitting element emitting blue light.

The light emitting elements may include an organic light emitting element or a light emitting element (e.g., quantum dot display element) emitting light by changing a wavelength of emitted light.

The display element layer DPL may include inorganic light emitting elements emitting light of only one color. The display element layer DPL may include blue inorganic light emitting elements. A light control layer may be disposed on the display element layer DPL. The light control layer may change a wavelength of light provided from the display element layer DPL. The light control layer may include a color conversion layer for changing a wavelength of light and/or a color filter layer for transmitting light having a specific wavelength.

A touch sensor receiving a touch input of a user and a window for protecting an exposed surface of the display panel 1000 may be additionally provided on the display element layer DPL. The touch sensor and the window may be optional.

Figure 3:
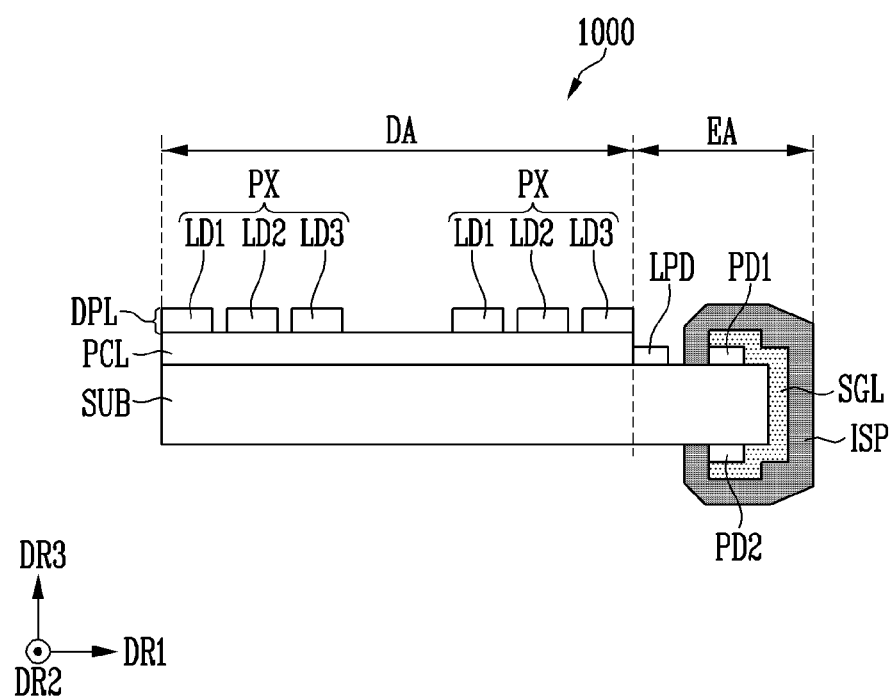
FIG. 3 is a cross-sectional view illustrating a display panel in accordance with embodiments.

FIG. 3 is a cross-sectional view illustrating a display panel 1000 in accordance with embodiments.

FIG. 3 shows a portion of the display panel 1000 including one side of the display panel 1000.

Referring to FIGS. 1, 2, and 3, the display panel 1000 may include a substrate SUB, a pixel circuit layer PCL, and a display element layer DPL.

In FIG. 3, components identical to or analogous to those described with reference to FIG. 2 are designated by like reference numerals provided in FIG. 2.

The display panel 1000 may include a display area DA and an edge area EA. Pixels PX formed by the pixel circuit layer PCL and the display element layer DPL may be disposed in the display area DA.

The display element layer DPL may include a first light emitting element LD1, a second light emitting element LD2, and a third light emitting element LD3. The first light emitting element LD1 and a corresponding connected pixel circuit may form a first sub-pixel. The second light emitting element LD2 and a corresponding connected pixel circuit may form a second sub-pixel. The third light emitting element LD3 and a corresponding connected pixel circuit may form a third sub-pixel. The first sub-pixel may include a plurality of first light emitting elements LD1, the second sub-pixel may include a plurality of second light emitting elements LD2, and the third sub-pixel may include a plurality of third light emitting elements LD3. Each of the first, second, and third light emitting elements LD1, LD2, and LD3 may be an inorganic light emitting diode having a micrometer size or a nanometer size.

The first to third sub-pixels may emit lights of different colors. The first, second, and third light emitting elements LD1, LD2, and LD3 may respectively emit lights of a first color, a second color, and a third color. The first color, the second color, and the third color may be respectively red, green, and blue. Therefore, the first to third sub-pixels may respectively emit lights of red, green, and blue.

The first, second, and third light emitting elements LD1, LD2, and LD3 may emit light of the same color. Wavelengths of lights emitted from the first, second, and third light emitting elements LD1, LD2, and LD3 may be controlled by a light control layer, and the first to third sub-pixels may respectively emit lights of the first, second, and third colors (e.g., red, green, and blue).

The edge area EA may be located outside the display area DA. The edge area EA may be positioned between the display areas DA of two immediately adjacent display panels 1000 in the tiled display device 10 shown in FIG. 1. The edge area EA may include an outermost portion of the substrate SUB. The edge area EA may include a side of the substrate SUB. A front/upper portion (e.g. a front/upper edge/non-display area) of the substrate SUB and a rear/lower portion (e.g. a rear/lower edge/non-display area) of the substrate SUB are connected to each other through the side of the substrate SUB.

In the tiled display device 10, a large display image is displayed through the arrangement of the plurality of display panels 1000. No image may be displayed on a bezel corresponding to the edge area EA. If a bezel area is significantly wide, the bezel may be undesirably conspicuous. The bezel area should be minimized so as to improve image quality.

Referring to FIG. 3, a side conductive line (e.g., a signal line SGL) may be formed in the edge area EA of the substrate SUB. The signal line SGL may electrically connect a first signal pad PD1 at the front/top of the substrate SUB and a second signal pad PD2 at the rear/bottom of the substrate SUB to each other. A bonding area of driving circuits is located at the rear of the substrate SUB, and the driving circuits are attached, formed, and/or mounted at the rear of the substrate SUB, so that the bezel area can be minimized.

A light emitting element pad LPD and the first signal pad PD1 may be disposed at the front/top of the edge area EA of the substrate SUB and may be spaced apart from each other.

The light emitting element pad LPD may be electrically connected to one or more pixel circuits of the pixel circuit layer PCL. The light emitting element pad LPD may be electrically connected to a second electrode (e.g., a cathode) of the display element layer DPL.

The first signal pad PD1 may be electrically connected to the light emitting element pad LPD through a connection line. The first signal pad PD1 may transfer, to the light emitting element pad LPD, a signal (e.g., a power voltage, a scan signal, or a data signal) supplied from the driving circuit.

The light emitting element pad LPD and the first signal pad PD1 may be directly disposed on the substrate SUB. At least some components of the pixel circuit layer PCL may extend to the front/top of the edge area EA of the substrate SUB, and conductive members of some of the corresponding components may form the light emitting element pad LPD and the first signal pad PD1.

The second signal pad PD2 may be disposed at the rear of the edge area EA of the substrate SUB. The second signal pad PD2 may be electrically connected to the driving circuit located at the rear of the substrate SUB through a conductive line. The driving circuit may be mounted on a printed circuit film, and the printed circuit film may be electrically connected to the second signal pad PD2.

Each of the first and second signal pads PD1 and PD2 may have a double-layer structure of copper (Cu) and titanium (Ti). The first and second signal pads PD1 and PD2 may include at least one of copper (Cu), molybdenum (Mo), tungsten (W), aluminum neodymium (AlNd), titanium (Ti), aluminum (Al), silver (Ag), and an alloy or mixture of some of the metals. The first and second signal pads PD1 and PD2 may include a transparent conductive material. The transparent conductive material may include at least one of ITO, IZO, ZnO, IGZO, and ITZO. The first and second signal pads PD1 and PD2 may have a single-layer structure or a multi-layer structure.

The signal line SGL may electrically connect the first signal pad PD1 and the second signal pad PD2 to each other and may directly contact the side of the edge area EA of the substrate SUB. The signal line SGL may be directly contact an upper exposed surface of the first signal pad PD1 and a lower exposed surface of the second signal pad PD2.

The signal line SGL may have a double-layer structure of copper (Cu) and titanium (Ti). The signal line SGL may include at least of copper (Cu), molybdenum (Mo), tungsten (W), aluminum neodymium (AlNd), titanium (Ti), aluminum (Al), silver (Ag), and an alloy or mixture of some of the metals. The signal line SGL may have a single-layer structure or a multi-layer structure.

An insulating pattern ISP may be disposed on the signal line SGL to protect the signal line SGL from moisture, oxygen, external contaminant, stress, impact, and the like. The insulating pattern ISP may cover the signal line SGL, the first signal pad PD1, and the second signal pad PD2. The insulating pattern ISP may surround and/or cover all exposed end portions and/or edges of the signal line SGL, the first signal pad PD1, and the second signal pad PD2. The insulating pattern ISP may protect and cover the signal line SGL, the first signal pad PD1, and the second signal pad PD2.

The insulating pattern ISP may be a photoresist pattern including a photoresist material and a black pigment. The signal line SGL may be formed by etching a conductive layer through openings of the insulating pattern ISP.

The insulating pattern ISP may include a black pigment and may entirely appear black. Thus, a visibility or image defect potentially caused by light reflected by the signal line SGL can be prevented by the insulating pattern ISP.

The black pigment may include at least one of carbon black and titanium black.

The insulating pattern ISP may protect the signal line SGL, may insulate the signal line SGL from other lines, and may block unwanted light reflection and/or transmission. Therefore, an additional over-coating process for side line protection and light blocking and an over-coating layer may be unnecessary.

An over-coating layer including a black pigment may be disposed on the insulating pattern ISP. The insulating pattern ISP may individually cover each signal line SGL. The over-coating layer may cover the entire side of the substrate SUB and may cover the signal line SGL. The over-coating layer may also cover a front portion and a rear portion of the substrate SUB. The over-coating layer may cover all end portions and/or edges of the insulating pattern ISP and the signal line SGL. Accordingly, the portion of the signal line SGL located at the front of the substrate SUB is concealed.

However, if the over-coating layer is added, the thickness of the over-coating layer may adversely affect the light emitting element pad LPD. As a result, an electrical connection defect of light emitting elements may occur.

In accordance with the embodiments, the over-coating process and the over-coating layer are unnecessary, so that the electrical connection defect can be prevented, a process yield of display panels can be improved.

Figure 4A:
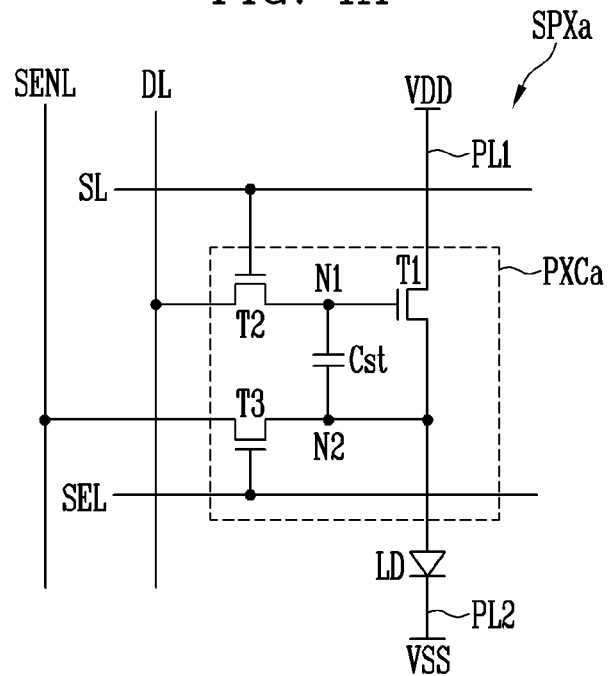
FIG. 4A is a circuit diagram illustrating a sub-pixel included in a display panel in accordance with embodiments.

FIG. 4A is a circuit diagram illustrating a sub-pixel included in a display panel in accordance with embodiments.

Referring to FIGS. 3 and 4A, a sub-pixel SPXa may include a light emitting element LD and a pixel circuit PXCa.

The light emitting element LD may be electrically connected between a first power line PL1 and a second power line PL2. A voltage of a first power source VDD may be provided to the first power line PL1, and a voltage of a second power source VSS may be provided to the second power line PL2. The first power source VDD may be set to have a potential higher than a potential of the second power source VSS.

A first end portion of the light emitting element LD may be electrically connected to the first power line PL1 via the pixel circuit PXCa, and a second end portion of the light emitting element LD may be electrically connected to the second power line PL2.

The light emitting element LD may emit light with a luminance corresponding to a driving current generated in the pixel circuit PXCa.

One light emitting element LD connected between the pixel circuit PXCa and the second power line PL2 is illustrated in FIG. 4A. The sub-pixel SPXa may include a plurality of light emitting elements LD. The light emitting elements LD may be connected in a parallel, series, or series/parallel hybrid structure between the pixel circuit PXCa and the second power line PL2.

The pixel circuit PXCa may include a first transistor T1, a second transistor T2, a third transistor T3, and a storage capacitor Cst.

The first transistor T1 (driving transistor) may be connected between the first power line PL1 and the light emitting element LD. A gate electrode of the first transistor T1 may be connected to a first node N1. The first transistor T1 may control the driving current, based on a voltage applied through the first node N1.

The second transistor T2 may be connected between a data line DL and the first node N1. A gate electrode of the second transistor T2 may be connected to a scan line SL. When a scan signal is supplied to the scan line SL, the second transistor T2 may be turned on, to transfer a data signal (data voltage) to the first node N1.

The third transistor T3 may be connected between a sensing line SENL and a second node N2. When the third transistor T3 is turned on in response to a sensing scan signal provided to a sensing scan line SEL, a reference voltage may be provided to the second node N2 through the sensing line SENL, or a current (e.g., a sensing current) generated from the first transistor T1 may flow in the sensing line SENL. The reference voltage may be set equal to or lower than the voltage of the second power source VSS.

The sensing current may be used to calculate a mobility of the first transistor T1 and a variation in threshold voltage.

The storage capacitor Cst may be connected between the first node N1 and the second node N2. The storage capacitor Cst may store information on a difference between the voltage of the first node N1 and a voltage of the second node N2.

One or more of the first to third transistors T1 to T3 may one or more N-type transistors. At least one of the first to third transistors T1 to T3 may be a P-type transistor.

Figure 4B:
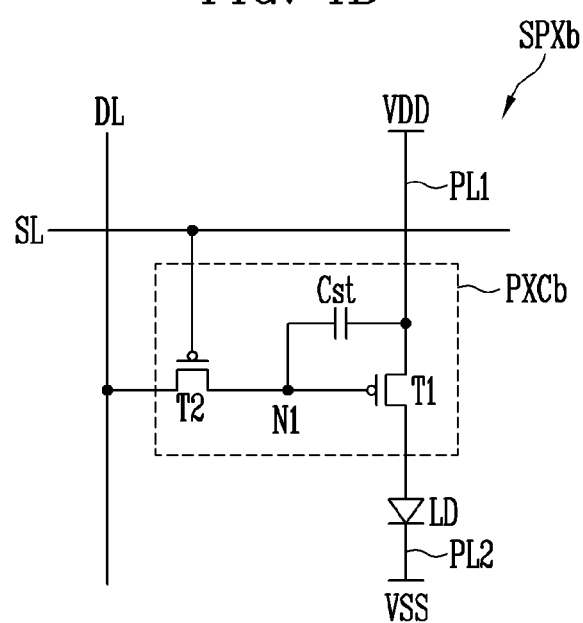
FIG. 4B is a circuit diagram illustrating a sub-pixel included in a display panel in accordance with embodiments.
Figure 4C:
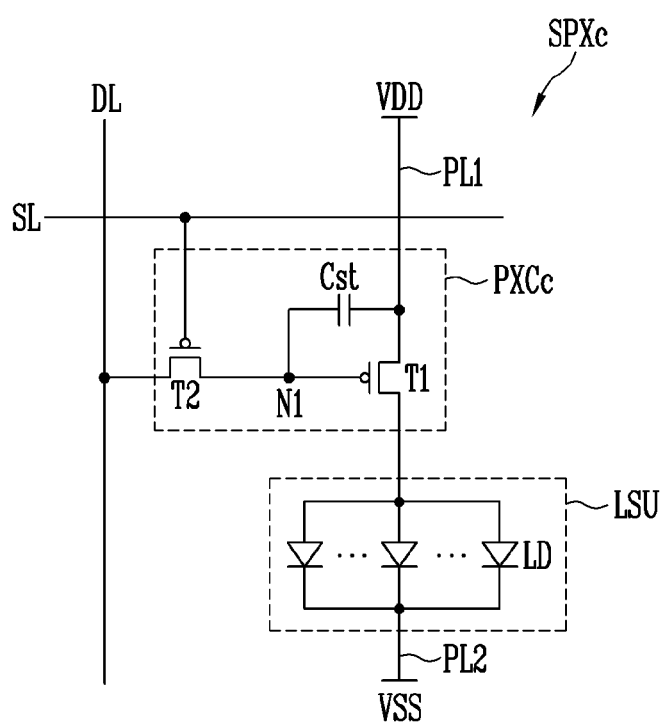
FIG. 4C is a circuit diagram illustrating a sub-pixel included in a display panel in accordance with embodiments.

Each of FIGS. 4B and 4C is a circuit diagram illustrating a sub-pixel included in a display panel in accordance with embodiments.

Referring to FIGS. 4B and 4C, each sub-pixel SPXb or SPXc may include a light emitting element LD and a pixel circuit PXCb or PXCc.

As shown in FIG. 4B, a sub-pixel SPXb may include a light emitting element LD for generating light with a luminance corresponding to a data signal, and a first transistor T1, a second transistor T2, and a storage capacitor Cst, which constitute a pixel circuit PXCb.

As shown in FIG. 4C, a sub-pixel SPXc may include a plurality of light emitting elements, and a first transistor T1, a second transistor T2, and a storage capacitor Cst, which constitute a pixel circuit PXCc. The light emitting elements LD may constitute one light emitting unit LSU. The light emitting elements LD may be connected in parallel in the same direction (e.g., a forward direction) between the first power source VDD and the second power source VSS, as illustrated in FIG. 4C. Some of the light emitting elements LD may be connected in the forward direction between the first and second power sources VDD and VSS, and the other some of the light emitting elements LD may be connected in a reverse direction. At least some of the light emitting elements LD may be connected in series.

The first transistor T1 may be connected between the first power source VDD and a first electrode of the light emitting element LD or first electrodes of the light emitting elements LD. A gate electrode of the first transistor T1 may be connected to a first node N1. The first transistor T1 may control a driving current supplied to the light emitting elements LD, corresponding to a voltage of the first node N1.

The second transistor T2 may be connected between a data line DL and the first node N1. A gate electrode of the second transistor T2 may be connected to a scan line SL.

The second transistor T2 may electrically connect the data line DL and the first node N1 to each other in response to a scan signal. Accordingly, a voltage corresponding to the data signal is charged in the storage capacitor Cst.

One electrode of the storage capacitor Cst may be connected to the first power line PL1, and the other electrode of the storage capacitor Cst may be connected to the first node N1.

Both the first and second transistors T1 and T2 may be P-type transistors. At least one of the first and second transistors T1 and T2 may be an N-type transistor.

Figure 4D:
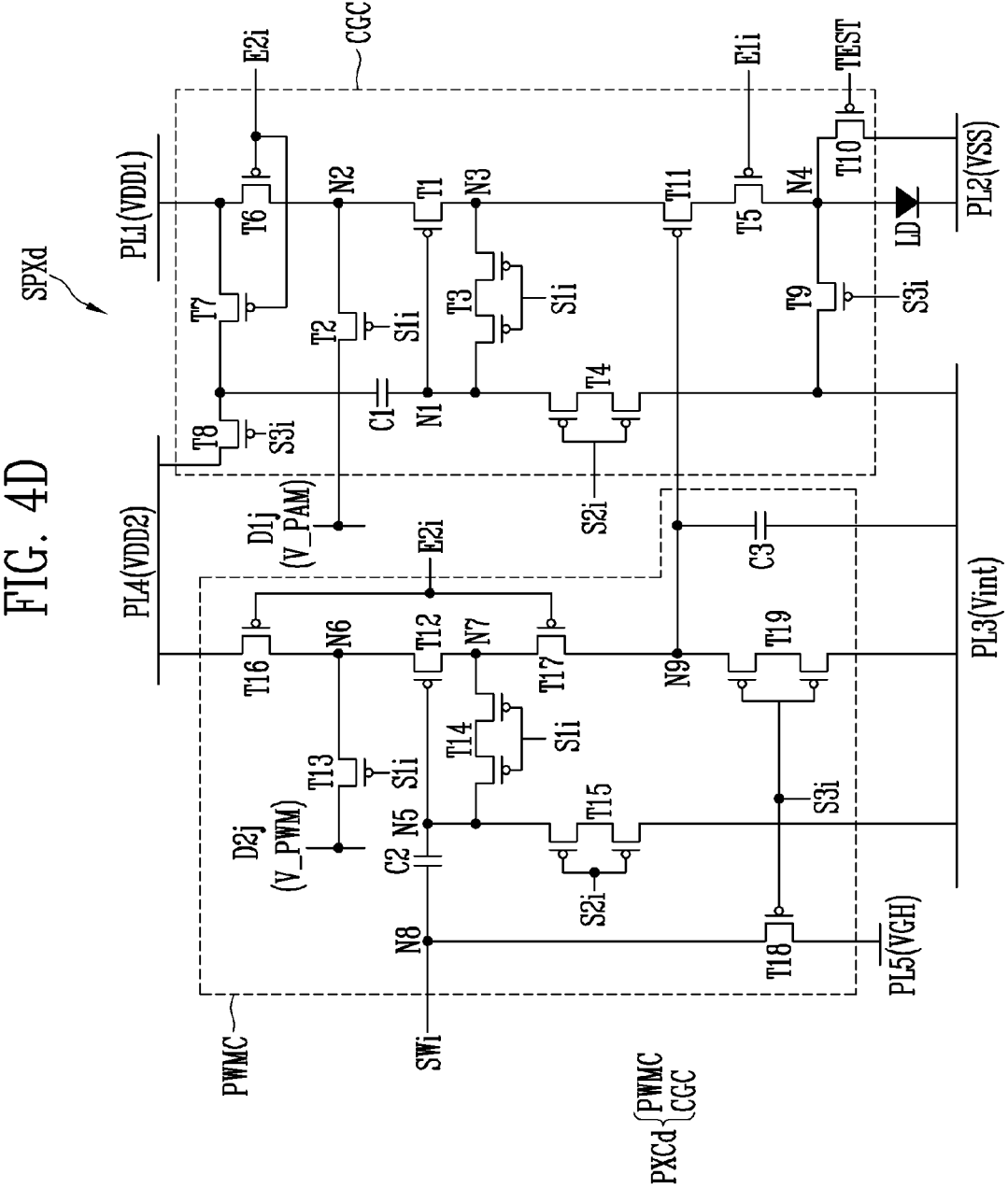
FIG. 4D is a circuit diagram illustrating a sub-pixel included in a display panel in accordance with embodiments.

FIG. 4D is a circuit diagram illustrating a sub-pixel included in a display panel shown in accordance with embodiments.

A sub-pixel SPXd located in an ith pixel row and connected to jth data lines D1j and D2j is illustrated in FIG. 4D (i and j are natural numbers).

Referring to FIG. 4D, the sub-pixel SPXd may include a light emitting element LD and a pixel circuit PXCd.

The light emitting element may be an inorganic light emitting diode having a micrometer size or a nanometer size.

The pixel circuit PXCd may include a pulse-width modulation (PWM) circuit PWMC and a current generating circuit CGC. The current generating circuit CGC may generate a constant current (a driving current) having a constant magnitude and supplied to the light emitting element LD. The PWM circuit PWMC may control a time for which the driving current is supplied to the light emitting element LD based on a PWM data voltage V_PWM.

The current generating circuit CGC may include first to eleventh transistors T1 to T11 and a first capacitor C1.

The first transistor T1 is a driving transistor and may generate the driving current supplied to the light emitting element LD during an emission period.

The second transistor T2 may be connected between a jth first data line D1j (a first data line) and a second node N2. The second transistor T2 may be turned on in response to a first scan signal supplied to an ith first scan line S1i (a first scan line).

A PAM data voltage V_PAM may be supplied to the first data line D1j. The PAM data voltage V_PAM may determine the magnitude of the driving current. An emission luminance of the light emitting element LD as the inorganic light emitting diode is not sensitive to a driving current change, unlike the organic light emitting diode. Therefore, the emission luminance of the light emitting element LD may be controlled by the time for which the driving current is supplied instead of the magnitude of the driving current.

The PAM data voltage V_PAM may be supplied with the same magnitude to the same kind of sub-pixels emitting light of the same color, regardless of a grayscale and the like. The PAM data voltage V_PAM may be configured according to a predetermined reference.

The third transistor T3 may be connected between a gate electrode of the first transistor T1 (e.g., a first node N1) and a drain electrode of the first transistor T1 (e.g., a third node N3). A gate electrode of the third transistor T3 may be connected to the first scan line S1i. The third transistor T3 may be turned on together with the second transistor T2, to allow the first transistor T1 to be diode-connected, thereby compensating for a threshold voltage of the first transistor T1. The third transistor T3 may include transistors that are connected in series and have gate electrodes connected commonly to the scan line S1i.

The fourth transistor T4 may be connected between the first node N1 and a third power line PL3 through which a voltage of an initialization power source Vint is supplied. The fourth transistor T4 may be turned on in response to a second scan signal supplied to an ith second scan line S2i (a second scan line). When the fourth transistor T4 is turned on, the voltage of the initialization power source Vint may be supplied to the first node N1. That is, a gate voltage of the first transistor T1 may be initialized. The fourth transistor T4 may include transistors connected in series and having gate electrodes connected commonly to the scan line S2i. The voltage of the initialization power source Vint may be a sufficiently low voltage at which transistors are turned on.

The fifth transistor T5 may be connected between the third node N3 and an anode electrode of the light emitting element LD (e.g., a fourth node N4). A gate electrode of the fifth transistor T5 may be connected to an ith first emission control line E1i (a first emission control line). The fifth transistor T5 may be turned on in response to a first emission control signal supplied to the first emission control line E1i.

The sixth transistor T6 may be connected between a first power line PL1 through which a voltage of the first power source VDD1 is supplied and the second node N2. The sixth transistor T6 may be turned on in response to a second emission control signal supplied to an ith second emission control line E1i (a second emission control line). The first emission control signal and the second emission control signal may be provided at the substantially same timing.

The seventh transistor T7 may be connected between the first power line PL1 and a first terminal of the first capacitor C1. The seventh transistor T7 may be turned on in response to the second emission control signal. Therefore, the first terminal of the first capacitor C1 may be connected to the first power source VDD1 in the emission period.

The eighth transistor T8 may be connected between a fourth power line PL4 through which a voltage of a third power source VDD2 is supplied and the first terminal of the first capacitor C1. The eighth transistor T8 may be turned on in response to a third scan signal supplied to an ith third scan line S3$i$ (a third scan line). When the eighth transistor T8 is turned on, the voltage of the third power source VDD2 may be supplied to the first terminal of the first capacitor C1.

The voltage of the third power source VDD2 and the voltage of the first power source VDD1 may be the same and be different from each other.

The first to third scan signals may be supplied in a non-emission period. The second scan signal may be supplied earlier than the first scan signal. The third scan signal may be supplied at the same timing as the second scan signal. The third scan signal may be supplied after the first scan signal is supplied.

A second terminal of the first capacitor C1 may be connected to the first node N1. The first capacitor C1 may serve as a storage capacitor storing the PAM data voltage V_PAM.

The ninth transistor T9 may be connected between the fourth node N4 and the third power line PL3. The ninth transistor T9 may supply the voltage of the initialization power source Vint to the fourth node N4 in response to the third scan signal.

The tenth transistor T10 may be connected between the fourth node N4 and a second power line PL2 through which a voltage of a second power source VSS is supplied. The tenth transistor T10 may be turned on in response to a test voltage supplied to a test line TEST.

The tenth transistor T10 may be turned on according to the test voltage before connection between the light emitting element LD and the pixel circuit PXCd during a manufacturing process, to be used in identifying whether the pixel circuit PXCd is abnormal.

The eleventh transistor T11 may be connected between the third node N3 and the fifth transistor T5. The eleventh transistor T11 may be turned on based on a voltage of a ninth node N9. A turn-on time of the eleventh transistor T11 may correspond to an emission period (emission duty) of the light emitting element LD).

The PWM circuit PWMC may control the turn-on time of the eleventh transistor T11, based on the PWM data voltage V_PWM. The PWM circuit PWMC may include twelfth to nineteenth transistors T12 to T19, a second capacitor C2, and a third capacitor C3.

The twelfth transistor T12 may be turned on during the emission period, based on the PWM data voltage V_PWM and a sweep voltage supplied to an ith sweep signal line SWi (a sweep signal line). The twelfth transistor T12 may be connected between a sixth node N6 and a seventh node N7. A gate electrode of the twelfth transistor T12 may correspond to a fifth node N5.

The thirteenth transistor T13 may be connected between a jth second data line D2$j$ and the sixth node N6. The thirteenth transistor T13 may provide the PWM data voltage V_PWM to the sixth node N6 in response to the first scan signal.

The fourteenth transistor T14 may be connected between the fifth node N5 and the seventh node N7. The fourteenth transistor T14 may compensate for a threshold voltage of the twelfth transistor T12 by allowing the twelfth transistor T12 to be diode-connected in response to the first scan signal. The fourteenth transistor T14 may include transistors connected in series and having gate electrodes connected commonly to the scan line S1$i$.

The fifteenth transistor T15 may be connected between the fifth node N5 and the third power line PL3. The fifteenth transistor T15 may supply the voltage of the initialization power source Vint to the fifth node N5 in response to the second scan signal. The fifteenth transistor T15 may include transistors connected in series and having gate electrodes connected commonly to the scan line S2$i$.

The sixteenth transistor T16 may be connected between the fourth power line PL4 and the sixth node N6. The seventeenth transistor T17 may be connected between the seventh transistor N7 and the ninth node N9. The sixteenth and seventeenth transistors T16 and T17 may be turned on in response to the second emission control signal. That is, the sixteenth and seventeenth transistors T16 and T17 may provide a conduction path between the fourth power line PL4 and the ninth node N9.

The eighteenth transistor T18 may be connected between an eighth node N8 to which a first terminal of the second capacitor C2 is connected and a fifth power line PL5 through which a voltage of a high-potential power source VGH is supplied. The eighteenth transistor T18 may supply the voltage of the high-potential power source VGH to the eighth node N8 in response to the third scan signal.

The second capacitor C2 may be connected between the fifth node N5 and the eighth node N8. Therefore, when the fifteenth and eighteenth transistors T15 and T18 are simultaneously turned on, a difference between the voltage of the high-potential power source VGH and the voltage of the initialization power source Vint may be stored at both ends of the second capacitor C2.

The nineteenth transistor T19 may be connected between the ninth node N9 and the third power line PL3. The nineteenth transistor T19 may supply the voltage of the initialization power source Vint to the ninth node N9 in response to the third scan signal. The third capacitor C3 may be connected between the ninth node N9 and the third power line PL3. Accordingly, the voltage of the initialization power source Vint is charged in the third capacitor C3, and the ninth node N9 maintains the voltage of the initialization power source Vint.

The ninth transistor T19 may include transistors connected in series and having gate electrodes connected commonly to the scan line S3$i$.

Subsequently, when the fifth and sixth transistors T5 and T6 are turned on, a current path is formed between the first power line PL1 and the second power line PL2. Therefore, the eleventh transistor T11 may be turned on, and the light emitting element LD may emit light. Light emission of the light emitting element LD may be started in a state in which the twelfth transistor T12 is turned off.

The PWM circuit PWMC may control a light emission time of the light emitting element LD based on a voltage set at the fifth node N5. The PWM circuit PWMC may control an operation of the eleventh transistor T11 based on the voltage set at the fifth node N5, so that the supply of driving current can be controlled.

The PWM data voltage V_PWM may have a voltage range in which the twelfth transistor T12 is turned off. The PWM data voltage V_PWM may be determined in a voltage range of 10V to 15V. The voltage of the third power source VDD2 may be about 10V. Therefore, when the voltage of the third power source VDD2 is supplied to the sixth node N6 as the sixteenth and seventeenth transistors T16 and T17 are turned on, a gate-source voltage of the twelfth transistor T12 is the threshold voltage or higher, and hence the twelfth transistor T12 may be turned off. When the twelfth transistor T12 is turned off, a turn-on state of the eleventh transistor T11 may be maintained by the voltage of the initialization power source Vint stored in the third capacitor C3, and the light emission time of the light emitting element LD may be maintained.

When the gate-source voltage of the twelfth transistor T12 is lowered to the threshold voltage or lower as the voltage of the fifth node N5 is changed, the twelfth transistor T12 is turned on, and the voltage of the second power source VDD2 is supplied to the ninth node N9. Therefore, the eleventh transistor T11 may be turned on. Accordingly, the light emission of the light emitting element LD may be suspended.

The sweep voltage provided to the sweep signal line SWi may be changed in synchronization with the supply of the first and second emission control signals. The sweep voltage may have a triangular wave shape in which the sweep voltage decreases during a period in which the first and second emission control signals are supplied. The sweep voltage may be a voltage linearly decreasing from 15V to 10V.

Since a change in the sweep voltage is coupled to the fifth node N5 through the second capacitor C2, the voltage of the fifth node N5 may be changed according to the change in the sweep voltage. Therefore, a time at which the twelfth transistor T12 is turned on may be determined according to a magnitude of the voltage set at the fifth node N5 by writing of the PWM data voltage V_PWM, and the light emission time of the light emitting element may be controlled.

Emission luminance may be adjusted through the control of the light emission time of the light emitting element.

Figure 5A:
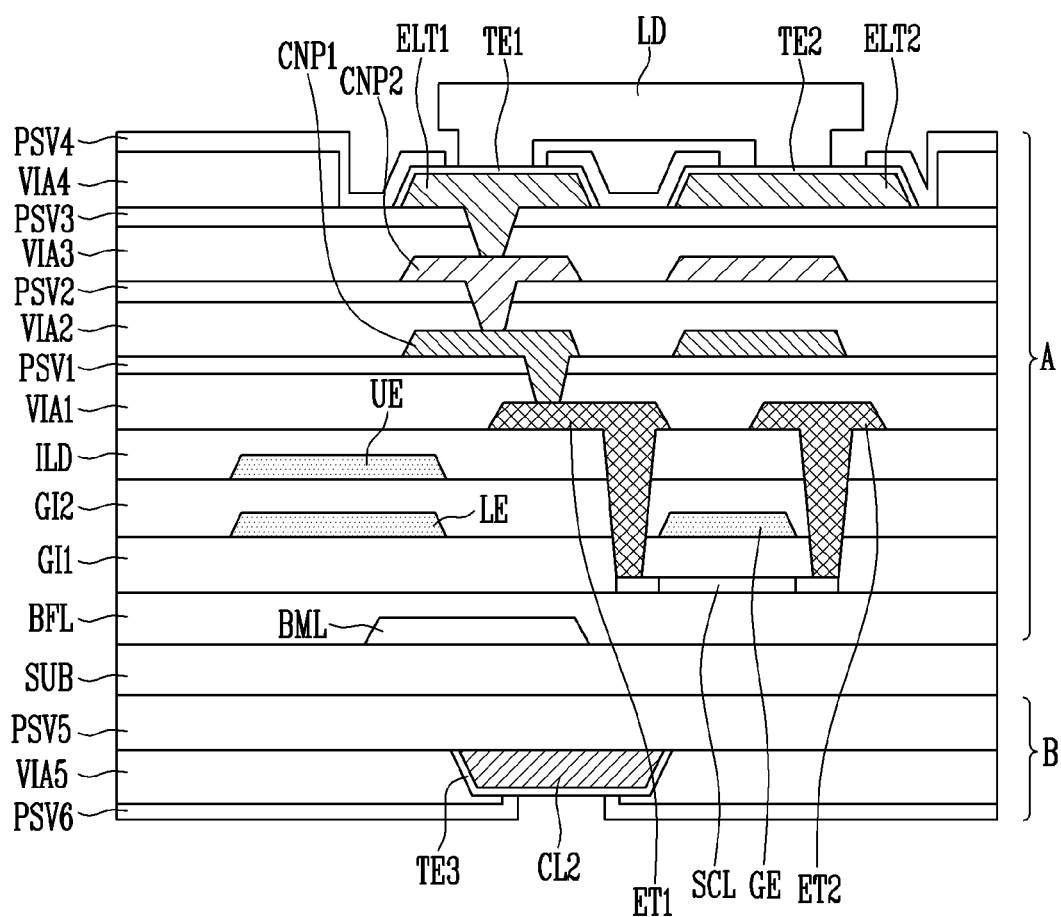
FIG. 5A is a cross-sectional view illustrating a display area of a display panel in accordance with embodiments.
Figure 5B:
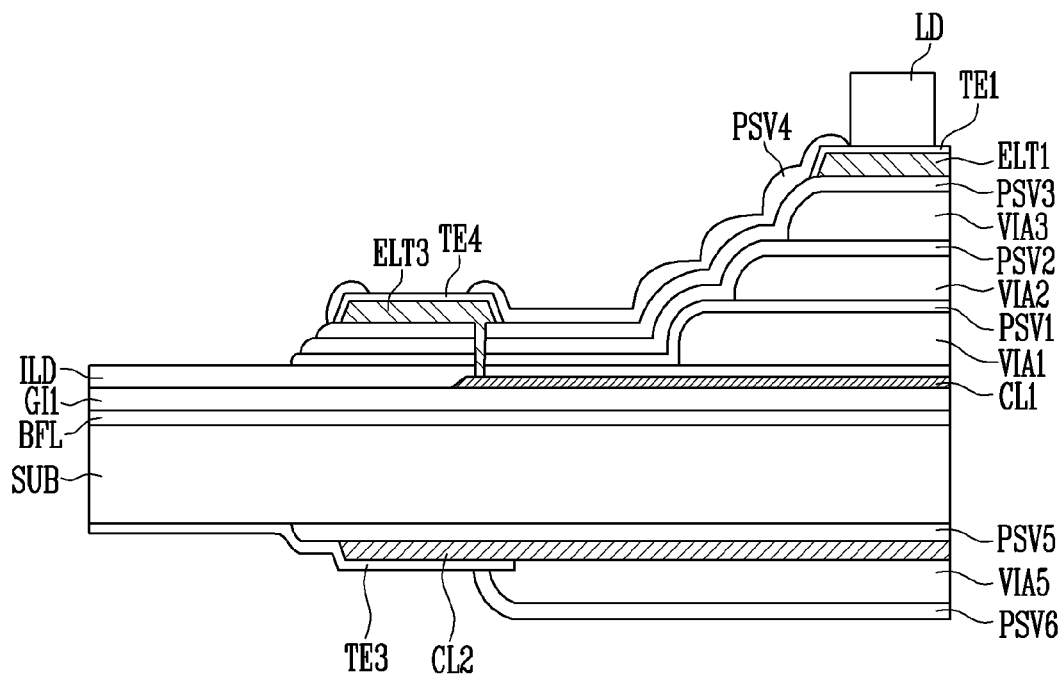
FIG. 5B is a cross-sectional view illustrating a portion of an edge area of a display panel in accordance with embodiments.

FIG. 5A is a cross-sectional view illustrating the display area of a display panel in accordance with embodiments. FIG. 5B is a cross-sectional view illustrating a portion of the edge/non-display area of a display panel in accordance with embodiments.

Referring to FIGS. 2, 3, 5A, and 5B, the display panel 1000 may include a substrate SUB, a pixel circuit layer PCL, and a display element layer DPL. The display panel 1000 may further include an encapsulation layer.

A predetermined stacked structure may be formed at each of a front A (or front/top/upper portion A) and a rear B (or rear/bottom/lower portion B) of the substrate SUB.

The pixel circuit layer PCL may be disposed at the front A of the substrate SUB and may include a plurality of insulating layers and a plurality of conductive layers. The insulating layers may include a buffer layer BFL, a first gate insulating layer GI1, a second gate insulating layer GI2, an interlayer insulating layer ILD, a first via layer VIA1, a first protective layer PSV1, a second via layer VIA2, a second protective layer PSV2, a third via layer VIA3, a third protective layer PSV3, a fourth via layer VIA4, and a fourth protective layer PSV4, which are sequentially provided on the substrate SUB.

The conductive layers may include a bottom metal layer BML provided on the substrate SUB, a first conductive layer provided on the first gate insulating layer GI1, a second conductive layer provided on the second gate insulating layer GI2, a third conductive layer provided on the interlayer insulating layer ILD, a fourth conductive layer provided on the first protective layer PSV1, a fifth conductive layer provided on the second protective layer PSV2, and a sixth conductive layer provided on the third protective layer PSV3. An insulating layer and/or a conductive layer in addition to the insulating layers and the conductive layers described above may be provided on the substrate SUB. Some of the insulating layers and/or some of the conductive layers may be optional.

A circuit layer including insulating layers and conductive layers may be disposed at the rear B of the substrate SUB. The insulating layers may include a fifth protective layer PSV5, a fifth via layer VIA5, and a sixth protective layer PSV6, which are sequentially stacked in the opposite direction of the third direction DR3. The conductive layers may contact the fifth protective layer PSV5.

The bottom metal layer BML shown in FIG. 5A may be made of at least one of gold (Au), silver (Ag), aluminum (Al), molybdenum (Mo), chromium (Cr), titanium (Ti), nickel (Ni), neodymium (Nd), copper (Cu), and an alloy of some of the metals. The bottom metal layer BML may be formed as a single layer or a multi-layer in which two or more of the metals and the alloys are stacked.

The bottom metal layer BML may be connected to one electrode (e.g., a source electrode) of a first transistor T1. The bottom metal layer BML may overlap a semiconductor pattern SCL of the first transistor T1, and may block light incident toward the semiconductor pattern SCL, thereby stabilizing an operation characteristic of the first transistor T1.

The buffer layer BFL may be provided on the substrate SUB. The buffer layer BFL may prevent an impurity from being diffused into a pixel circuit. The buffer layer BFL may be an inorganic insulating layer including an inorganic material. The buffer layer BFL may include at least one of silicon nitride ($SiN_x$), silicon oxide ($SiO_x$), silicon oxynitride ($SiO_xN_y$), and metal oxide such as aluminum oxide ($AlO_x$).

The buffer layer BFL may be a single layer or may have a multi-layer structure including at least two layers. When the buffer layer BFL has a multi-layer structure, the buffer layer BFL may include layers formed of the same material or different materials. The buffer layer BFL may include a silicon oxide ($SiO_x$) layer disposed on a silicon nitride ($SiN_x$) layer. The buffer layer BFL may be optional according to the material and process conditions of the substrate SUB.

The first transistor T1 may include the semiconductor pattern SCL, a gate electrode GE, a first transistor electrode ET1, and a second transistor electrode ET2. The first transistor electrode ET1 may be one of a source electrode and a drain electrode, and the second transistor electrode ET2 may be the other of the source electrode and the drain electrode. When the first transistor electrode ET1 is the drain electrode, the second transistor electrode ET2 may be the source electrode.

The other transistors may be formed in substantially the same stacked structure as the first transistor T1.

The semiconductor pattern SCL may be provided and/or formed on the buffer layer BFL. The semiconductor pattern SCL may include a first contact region in contact with the first transistor electrode ET1 and may include a second contact region in contact with the second transistor electrode ET2. A region between the first contact region and the second contact region may be a channel region. The channel region may overlap with the gate electrode GE. The transistor semiconductor pattern SCL may be made of polysilicon, amorphous silicon, an oxide semiconductor, or the like. The channel region may be undoped with an impurity and/or may be an intrinsic semiconductor. Each of the first contact region and the second contact region may be doped with an impurity.

The gate electrode GE may be provided on the first gate insulating layer GI1 of the semiconductor pattern SCL. The gate electrode GE may overlap the channel region of the semiconductor pattern SCL. The gate electrode GE may be included in the first conductive layer.

The gate electrode GE may include one of copper (Cu), molybdenum (Mo), tungsten (W), aluminum neodymium (AlNd), titanium (Ti), aluminum (Al), silver (Ag), and an alloy or mixture of some of the metals. The gate electrode GE may have a single-layer structure or a multi-layer structure.

A lower electrode LE constituting one electrode of a storage capacitor may be disposed in the first conductive layer.

The first gate insulating layer GI1 may be an inorganic insulating layer including an inorganic material. The first gate insulating layer GI1 may include at least one of silicon nitride ($SiN_x$), silicon oxide ($SiO_x$), silicon oxynitride ($SiO_xN_y$), and metal oxide such as aluminum oxide ($AlO_x$). The first gate insulating layer GI1 may be an organic insulating layer including an organic material. The first gate insulating layer GI1 may be a single layer or a multi-layer structure.

Each of the first transistor electrode ET1 and the second transistor electrode ET2 may be provided in the interlayer insulating layer ILD. The first transistor electrode ET1 and the second transistor electrode ET2 may be respectively in contact with the first contact region and the second contact region of the semiconductor pattern SCL through contact holes penetrating the first and second gate insulating layers GI1 and GI2 and the interlayer insulating layer ILD. The first transistor electrode ET1 may be in contact with the first contact region of the semiconductor pattern SCL, and the second transistor electrode ET2 may be in contact with the second contact region of the semiconductor pattern SCL.

The first transistor electrode ET1 and the second transistor electrode ET2 may be included in the third conductive layer. Each of the first and second transistor electrodes ET1 and ET2 may include the same material(s) as the gate electrode GE or may include one or more materials the same as one or more of the materials constituting the gate electrode GE. The third conductive layer may be a multi-layer structure in which titanium, aluminum, and titanium are sequentially stacked.

The interlayer insulating layer ILD may include the same material(s) as the first gate insulating layer GI1 or may include one or more materials the same as one or more of the materials constituting the first gate insulating layer GI1. The interlayer insulating layer ILD may include a silicon oxide ($SiO_x$) layer disposed on a silicon nitride ($SiN_x$) layer.

The first transistor T1 may be a low temperature polysilicon (LTPS) thin film transistor. At least one of the transistors, including the first transistor T1, may be an oxide semiconductor thin film transistor. The first transistor T1 may have a top gate structure.

The second conductive layer may be disposed on the interlayer insulating layer ILD. The second conductive layer may include an upper electrode UE as one electrode of the storage capacitor. The second conductive layer may further include a power line, a signal line, an additional gate electrode of the first transistor T1, and the like.

The second gate insulating layer GI2 may include the same material(s) as the first gate insulating layer GI1 or may include one or more materials the same as one of more of the material constituting the first gate insulating layer GI1. The second gate insulating layer GI2 may include silicon nitride ($SiN_x$).

The first via layer VIA1 may be provided on the interlayer insulating layer ILD, on which the first transistor electrode ET1 and the second transistor electrode ET2 are disposed. The first via layer VIA1 may be an organic insulating layer. The first via layer VIA1 may include at least one of acrylic resin, epoxy resin, phenolic resin, polyamide resin, polyimide resin, unsaturated polyester resin, poly-phenylene ether resin, poly-phenylene sulfides resin, and benzocyclobutene resin. The first via layer VIA1 may reduce a step difference caused by components disposed on one or more of the underlying layers.

The first protective layer PSV1 may be provided on the first via layer VIA1. The first protective layer PSV1 may be an inorganic insulating layer. The inorganic insulating layer may include at least one of silicon nitride ($SiN_x$), silicon oxide ($SiO_x$), silicon oxynitride ($SiO_xN_y$), and metal oxide such as aluminum oxide ($AlO_x$).

The fourth conductive pattern including a first connection pattern CNP1 may be disposed on the first protective layer PSV1. The first connection pattern CNP1 may be connected to the first transistor electrode ET1 through a contact hole. The fourth conductive layer may include a power line, a data line, a scan line, and the like.

The fourth conductive layer may include one or more materials the same as one or more of the material(s) constituting the gate electrode GE. The fourth conductive layer may have a multi-layer structure in which titanium, aluminum, and titanium are sequentially stacked.

The second via layer VIA2 may be provided on the first protective layer PSV1. The second via layer VIA2 may be an organic insulating layer. The second via layer VIA2 may include the same material as the first via layer VIA1.

The second protective layer PSV2 may be provided on the second via layer VIA2. The second protective layer PSV2 may be an inorganic insulating layer, analogous to the first protective layer PSV1.

The fifth conductive layer including a second connection pattern CNP2 may be disposed on the second protective layer PSV2. The second connection pattern CNP2 may be connected to the first connection pattern CNP1 through a contact hole. The fifth conductive layer may include a power line, a data line, a scan line, and the like.

The fifth conductive layer may include one or more materials the same as one or more of the material(s) constituting the gate electrode GE. The fifth conductive layer may have a multi-layer structure in which titanium, aluminum, and titanium are sequentially stacked.

The third via layer VIA3 may be provided on the second protective layer PSV2. The third via layer VIA3 may be an organic insulating layer. The third via layer VIA3 may include the same material as the second via layer VIA2. The third via layer VIA3 may serve as a planarization layer.

The third protective layer PSV3 may be provided on the third via layer VIA3. The third protective layer PSV3 may be an inorganic insulating layer, analogous to the first protective layer PSV1.

The display element layer DPL may be provided on the third protective layer PSV3. The display element layer DPL may include a first electrode ELT1, a second electrode ELT2, and a light emitting element LD.

The first electrode ELT1 and the second electrode ELT2 may be provided on the third protective layer PSV3. The first electrode ELT1 may be connected to a first end portion of the light emitting element LD.

The first electrode ELT1 may be electrically and/or physically connected to the first transistor electrode ET1 of the first transistor T1 through a contact hole. The first electrode ELT1 may be an anode.

The second electrode ELT2 may be disposed on the same layer as the first electrode ELT1. The second electrode ELT2 may be connected to a second end portion of the light emitting element LD. The second electrode ELT2 may be a cathode.

The first electrode ELT1 and the second electrode ELT2 may be formed of a material having a predetermined reflective to allow light emitted from the light emitting element LD to advance in an image display direction of the display device (e.g., a front direction). The first electrode ELT1 may include an opaque metal. The opaque metal may include at least one of silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy of some of the metals.

Transparent electrodes TE1 and TE2 respectively covering the first electrode ELT1 and the second electrode ELT2 may be disposed on the first electrode ELT1 and the second electrode ELT2. The transparent electrodes TE1 and TE2 may substantially cover the first electrode ELT1 and the second electrode ELT2, thereby preventing damage of the first electrode ELT1 and the second electrode ELT2.

The transparent electrodes TE1 and TE2 may include a transparent conductive material (or substance). The transparent conductive material (or substance) may include at least one of a conductive oxide such as indium tin oxide (ITO), indium zinc oxide (IZO), zinc oxide (ZnO), indium gallium zinc oxide (IGZO), or indium tin zinc oxide (ITZO), a conductive polymer such as (poly(3,4-ethylenedioxythiophene) PEDOT, and the like.

Each of the first electrode ELT1 and the second electrode ELT2 may be a single layer. At least one of the first electrode ELT1 and the second electrode ELT2 may have a multi-layer structure in which at least two material layers of metals, alloys, conductive oxide, and/or conductive polymers are stacked. The first electrode ELT1 may have a multi-layer structure in which titanium, aluminum, and titanium are sequentially stacked.

The light emitting element LD may be provided on the first electrode ELT1 and the second electrode ELT2. The light emitting element LD may be bonding-coupled to the first electrode ELT1 and the second electrode ELT2.

The fourth via layer VIA4 may be provided on the third protective layer PSV3. The fourth via layer VIA4 may be an organic insulating layer. The fourth via layer VIA4 may include the same material as the first via layer VIA1. The fourth via layer VIA4 may be spaced from the first electrode ELT1, and may serve as a pixel defining layer. A height of the fourth via layer VIA4 may be higher than a height of the light emitting element LD.

The fourth protective layer PSV4 may be disposed on the first electrode ELT1, the second electrode layer ELT2, and the fourth via layer VIA4, and may expose a portion of the first electrode ELT1. The fourth protective layer PSV4 may be an inorganic insulating layer, analogous to the first protective layer PSV1.

An encapsulation layer may be disposed on the display element layer DPL. The encapsulation layer may prevent the light emitting element LD from being damaged or contaminated due to infiltration of an impurity such as moisture or air from the outside.

The fifth protective layer PSV5 may be provided at the rear B of the substrate SUB. The fifth protective layer PSV5 may be an inorganic insulating layer, analogous to the first protective layer PSV1.

A seventh conductive layer including a second connection line CL2 may be provided at a rear of the fifth protective layer PSV5. The second connection line CL2 may extend from the display area DA to the edge area EA. The second connection line CL2 may be electrically connected to an external driving circuit. The seventh conductive layer may have a multi-layer structure in which titanium, aluminum, and titanium are sequentially stacked.

A transparent electrode TE3 may surround at least a portion of the second connection line CL2. The transparent electrode ET3 may cover the rear of the second connection line CL2 exposed from the fifth via layer VIA5, thereby preventing damage of the second connection line CL2. The transparent electrode TE3 and a portion of the second connection line CL2 that contacts the transparent electrode TE3 may be (part of) the second signal pad PD2.

Therefore, the second signal pad PD2 may overlap with the display area DA, in which the light emitting element LD is disposed. The second signal pad PD2 may overlap with the edge area EA and/or the display area DA at the rear of the substrate SUB.

The fifth via layer VIA5 and the sixth protective layer PSV6 may expose a portion of the seventh conductive layer and may be sequentially provided at the rear of the fifth protective layer PSV5. The fifth via layer VIA5 may be an organic insulating layer including the same material as the first via layer VIA1. The sixth protective layer PSV5 may be an inorganic insulating layer, analogous to the first protective layer PSV1.

As shown in FIG. 5B, a third electrode ELT3 connected to a first connection line CL1 through a contact hole may be provided in the edge area EA. The third electrode ELT3 may be formed through the same process as the first and second electrodes ELT1 and ELT2.

A transparent electrode TE4 may surround at least a portion of the third electrode ELT3. The transparent electrode ET4 may cover the first connection line CL1, thereby preventing damage of the first connection line CL1. The transparent electrode TE4 and a portion of the first connection line CL1 that contacts the transparent electrode TE4 may be (part of) the first signal pad PD1.

The first signal pad PD1 and the second signal pad PD2 (including a portion of the second connection line CL2 and a portion of the transparent electrode TE3 in contact with each other) may be provided in the edge area EA.

The via layers VIA1 to VIA5, which are organic layers, may not substantially cover the edge area EA, and some inorganic layers may extend beyond the organic layers in the edge area EA.

The first connection line CL1 may extend up to the edge area EA on the first gate insulating layer GI1. The first signal pad PD1 may be formed on the third protective layer PSV3.

The second signal pad PD2 (including a portion of the second connection line CL2 and a portion of the transparent electrode TE3 in contact with each other) and the first signal pad PD1 (a portion of the first connection line CL1 or the third electrode ELT3 and a portion of the transparent electrode TE4 in contact with each other) may be connected to each other through a signal line formed at a side of the substrate SUB.

Figure 10A:
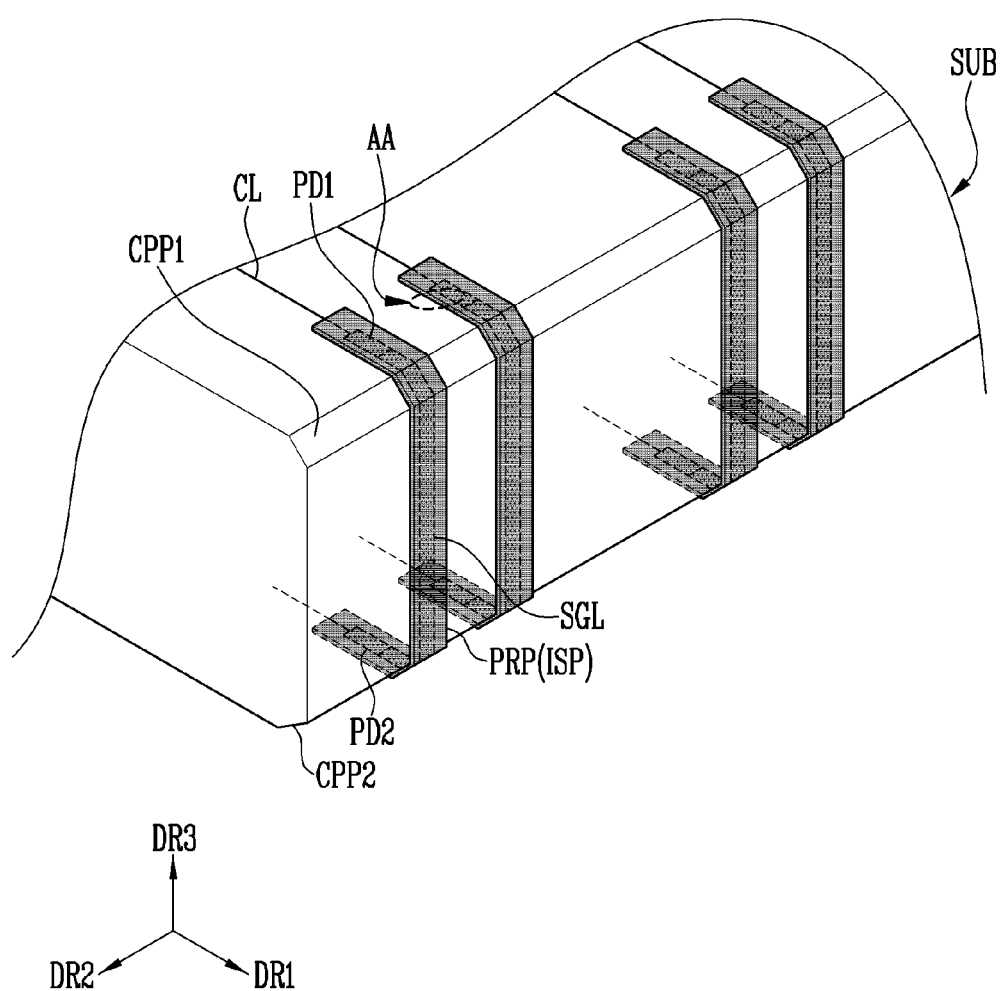
Figure 10B:
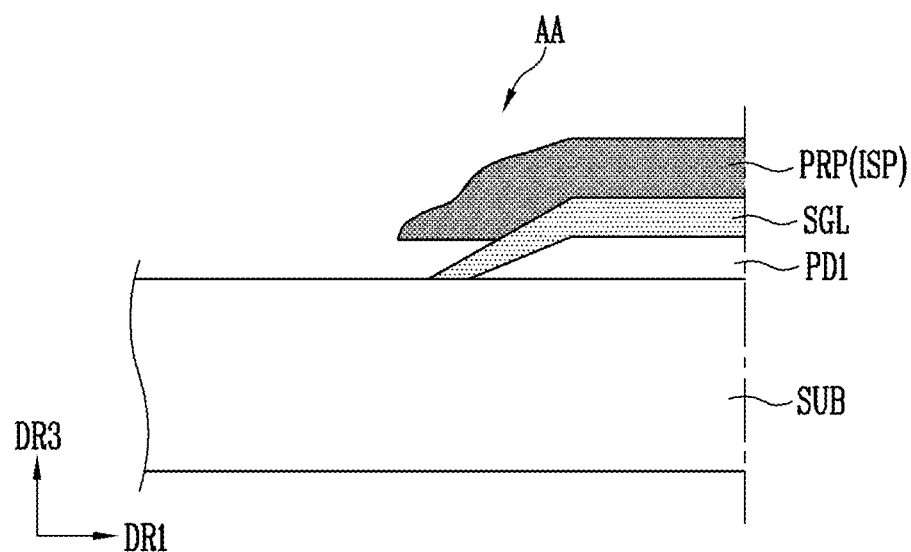
Figure 11:
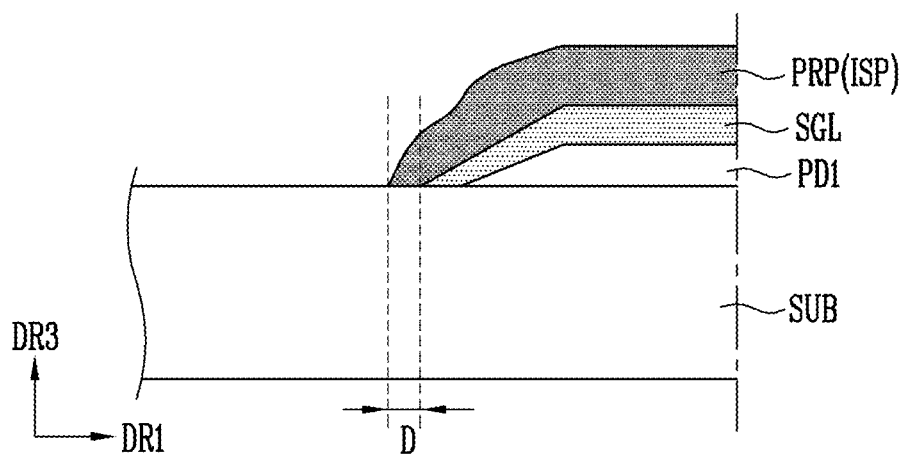

FIG. 6 is a flowchart illustrating a method of manufacturing a display panel in accordance with embodiments. FIGS. 7 to 11 illustrate structures formed in the method in accordance with embodiments. FIG. 11 is a cross-sectional view illustrating a structure obtained by curing the photoresist pattern shown in FIG. 10B at a high temperature in accordance with embodiments.

In FIGS. 6 to 11, components identical to or analogous to those described with reference to FIG. 3 are designated by like reference numerals provided in FIG. 3.

Referring to FIGS. 3 and 6 to 11, the method of manufacturing the display panel 1000 may include forming/providing signal pads PD1 and PD2 in a front/top edge area (or first face) and a rear/bottom edge area (or second face) of a substrate SUB (in a step S100), depositing/providing a conductive layer CDL on the front edge area, the rear edge area, and a side (or third face) of the substrate SUB (in a step S200), transferring a photoresist pattern PRP from a mold onto the conductive layer CDL (in a step S300), pre-curing the photoresist pattern PRP (in a step S400), forming a signal line SGL by etching (exposed portions of) the conductive layer CDL (in a step S500), and capping/covering an end portion (or edge) of the signal line SGL by curing the photoresist pattern PRP at a high temperature (in a step S600).

In the process of manufacturing the display panel 1000 and/or when the display panel 1000 is not in use for displaying images, the front edge area may be an upper surface of the substrate SUB, and the rear edge area may be a lower surface of the substrate SUB with respect to the third direction DR3. The side of the substrate SUB may be a surface between a first chamfer surface CPP1 and a second chamfer surface CPP2.

Each of the first chamfer surface CPP1 and the second chamfer surface CPP2 may be formed in the edge area EA of the substrate SUB. The first chamfer surface CPP1 may be formed by chamfering a corner that connects the front and side of the substrate SUB. The second chamfer surface CPP2 may be formed by chamfering a corner that connects the rear and side of the substrate SUB. The first and second chamfer surfaces CPP1 and CPP2 may be formed at angles formed symmetrical to each other by considering processing efficiency. The angles of the first and second chamfer surfaces CPP1 and CPP2 may be formed different from each other according to a condition or environment in which the substrate SUB is installed.

The chamfer surfaces CPP1 and CPP2 may facilitate the handling of the substrate SUB.

If no chamfer surface is provided in the edge area EA of the substrate SUB, damage (such as chipping) may occur at a right-angled corner of the substrate SUB when the corner of the substrate SUB is in contact with a jig (not shown) for substrate fixation when the substrate SUB is aligned or fixed, or when the substrate SUB receives an impact or collision. The chamfer surfaces CPP1 and CPP2 may significantly reduce the possibility of the damage.

Stress at the corners can be distributed by the chamfer surfaces CPP1 and CPP2 in the edge area EA. The chamfer surfaces CPP1 and CPP2 may enable side conductive lines (formed by etching the conductive layer CDL) to adhere securely to the substrate SUB and/or may minimize cracks in the side conductive lines.

Figure 7:
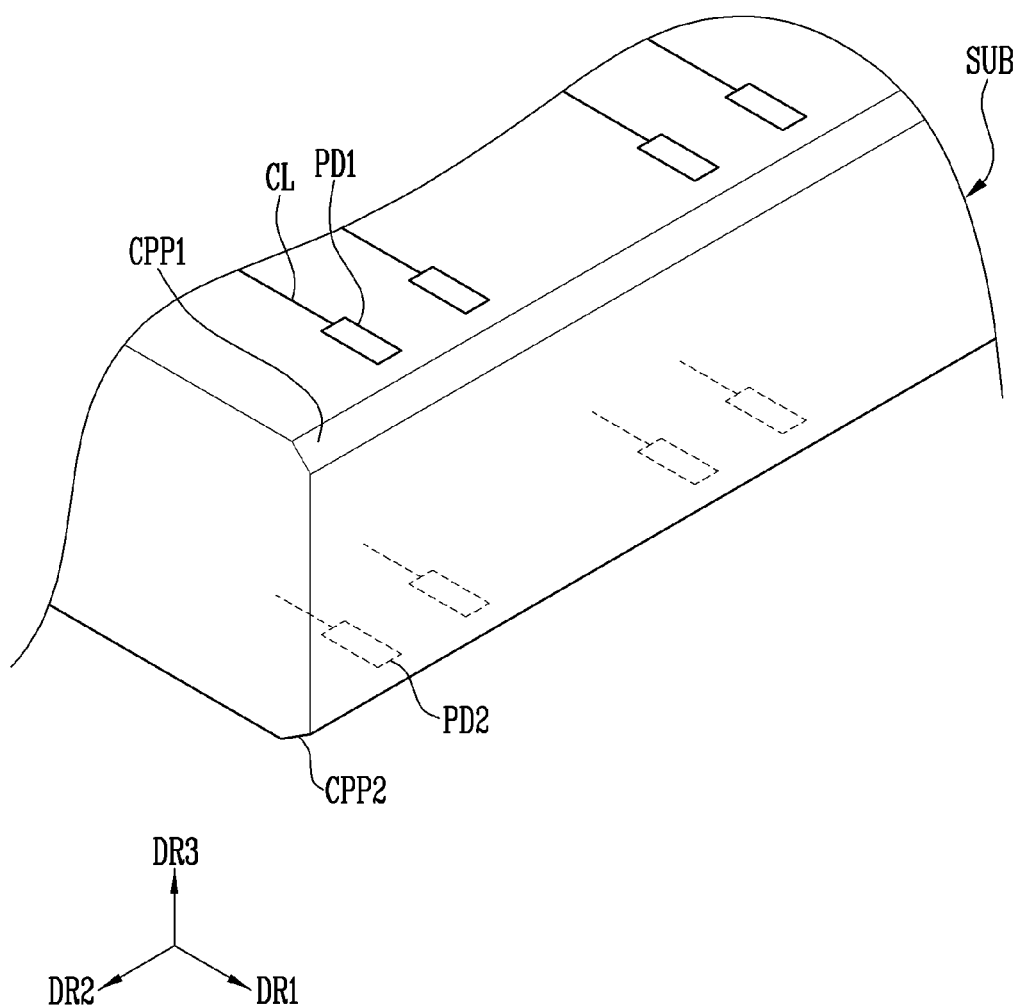
FIG. 7, FIG. 8, FIG. 9A, FIG. 9B, FIG. 9C, FIG. 10A, FIG. 10B, and FIG. 11 illustrate structures formed in a method of manufacturing a display panel in accordance with embodiments.

As shown in FIG. 7, the signal pads PD1 and PD2 may be formed in/on the front edge area and the rear edge area of the substrate SUB. The first signal pads PD1 and the second signal pads PD2 may be formed through patterning of a conductive material. Each of first signal pads PD1 and second signal pads PD2 may be connected to a conductive line CL.

The first signal pads PD1 may protrude in the third direction DR3 from the substrate SUB. The second signal pads PD2 may protrude in the opposite direction of the third direction DR3 from the substrate SUB.

Figure 8:
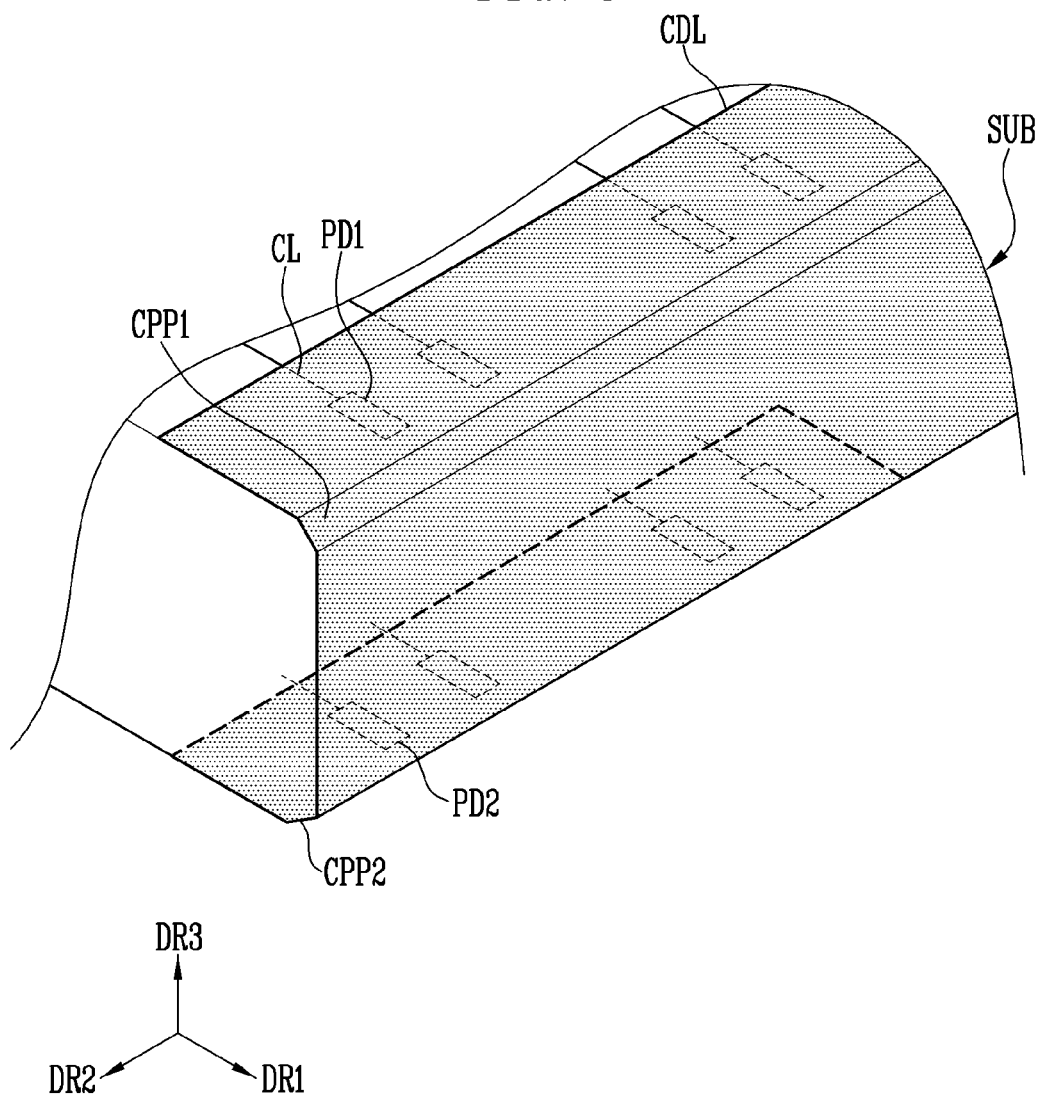

Subsequently, as shown in FIG. 8, the conductive layer CDL may be deposited (or provided) on the front edge area, the rear edge area, and the side of the substrate SUB. The conductive layer CDL may be integrally formed through a sputtering process.

The conductive layer CDL may include copper and/or titanium. The conductive layer CDL may have a double-layer structure of copper and titanium. The conductive layer CDL may include at least one of copper (Cu), molybdenum (Mo), tungsten (W), aluminum neodymium (AlNd), titanium (Ti), aluminum (Al), silver (Ag), and an alloy or mixture of one or more of the metals. The conductive layer CDL may include a transparent conductive material. The transparent conductive material may include at least one of ITO, IZO, ZnO, IGZO, ITZO, and the like. The conductive layer CDL may have a single-layer structure or a multi-layer structure.

The conductive layer CDL may cover all of the first signal pads PD1 and the second signal pads PD2. The conductive layer CDL may cover portions of the front edge area of the substrate SUB that are beyond the first signal pads PD1, and may cover portions of the rear edge area of the substrate SUB that are beyond the second signal pads PD2.

Figure 9A:
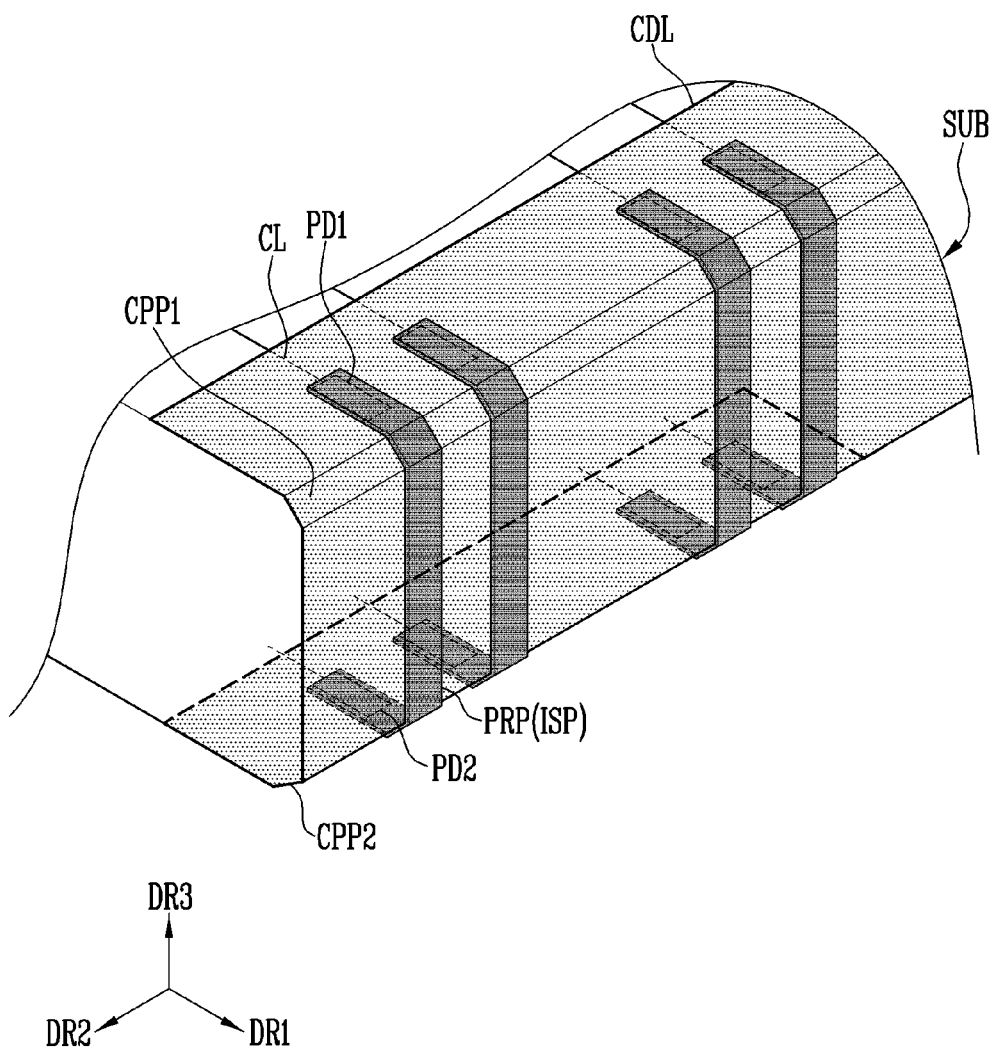

Subsequently, as shown in FIG. 9A, the photoresist pattern PRP may be transferred/provided onto the front edge area, the read edge area, and the side of the substrate SUB to cover strip areas of the conductive layer CDL. The photoresist pattern PRP may be used to form the insulating pattern ISP described above.

The photoresist pattern PRP may overlap an entire face of the first signal pad PD1 and may overlap an entire face of the second signal pad PD2. The photoresist pattern PRP may include photoresist members that are spaced from each other in the second direction DR2. Each of the photoresist members may overlap a corresponding first signal pad PD1, a corresponding second signal pad PD2, and the side of the substrate SUB; the first signal pad PD1 and the second signal pad PD2 may be positioned between and covered by two opposite sections of the photoresist member.

Figure 9B:
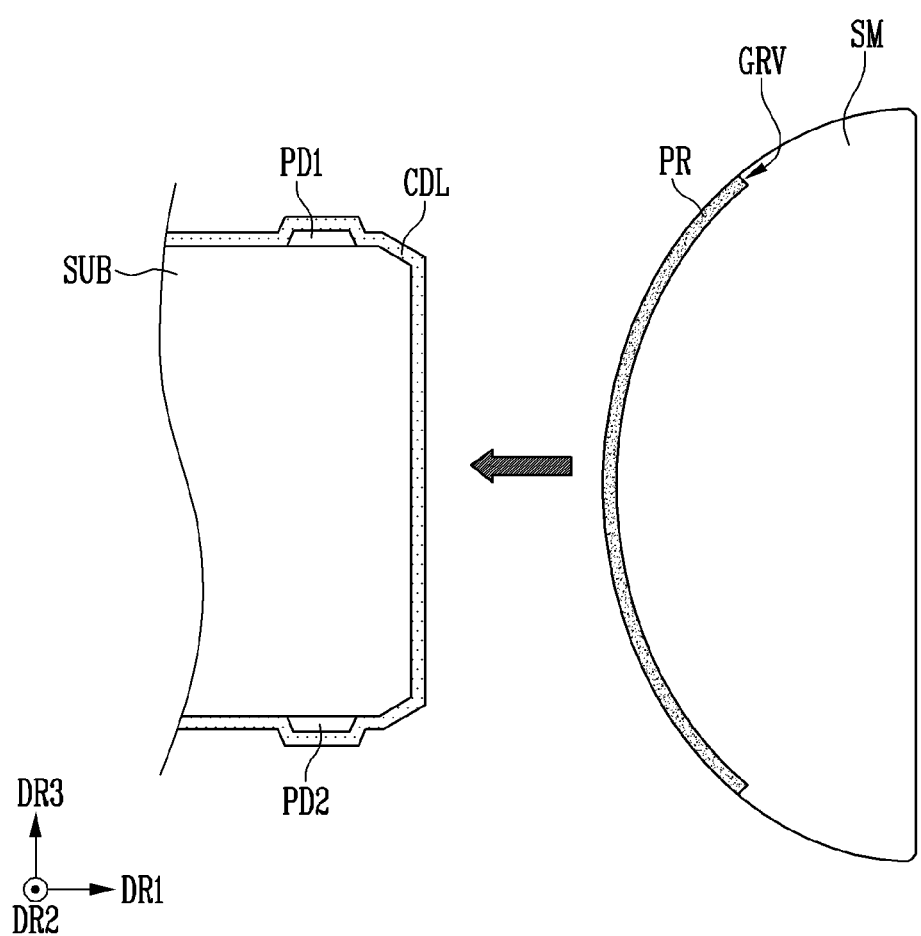
Figure 9C:
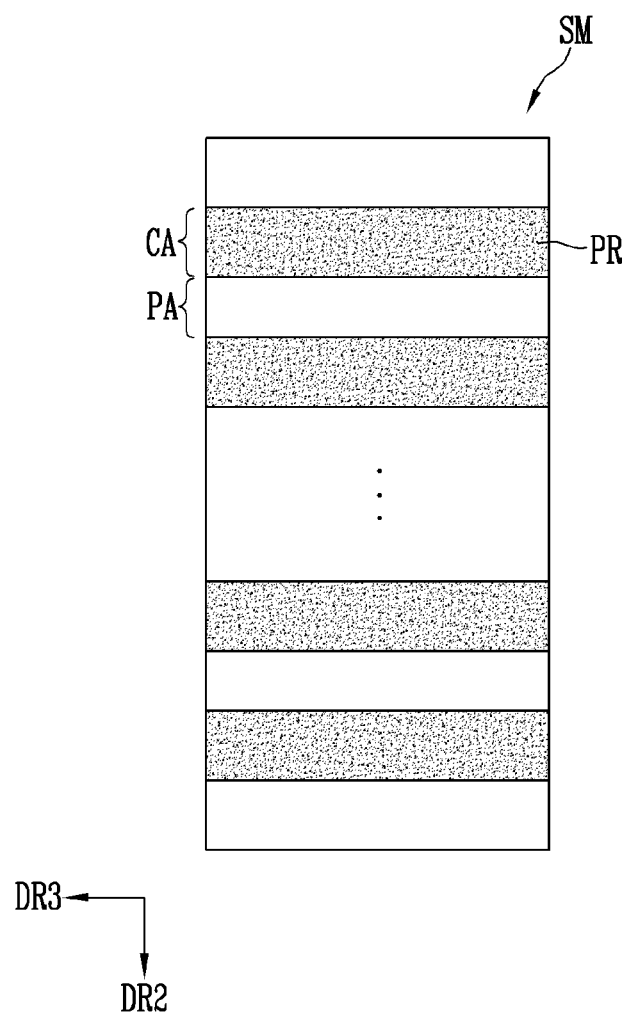

Referring to FIGS. 9B and 9C, the photoresist pattern PRP may be transferred onto the substrate SUB through a printing technique using a silicon mold SM.

First, a photoresist PR may be transferred onto/into the silicon mold SM. The photoresist PR may include not only a photoresist (including a photosensitive material) but also a black pigment. The photoresist may include a binder including a photosensitive polymer. The photoresist PR may include a monomer (e.g., an epoxy-based material) for reflow in a curing process of the photoresist pattern PRP, a black pigment for exhibiting black (and/or absorbing light), and a dispersant for uniformly dispersing the black pigment in the photoresist.

The black pigment may include at least one of carbon black, titanium black, and the like.

The silicon mold SM may be a pad having ductility and/or elasticity. The silicon mold SM may be deformed by a force and may return to the original shape when the force is removed.

The silicon mold SM may include grooves GRV corresponding to the shapes of the separate photoresist members of the photoresist pattern PRP. The silicon mold SM may include transfer areas CA in which the photoresist PR is transferred and peripheral areas PA between the transfer areas CA. The photoresist PR is not transferred in the peripheral area PA. Each of the transfer areas CA may correspond to a grove GRV that accommodates a photoresist member of the photoresist pattern PRP shown in FIG. 9A.

Distances between the transfer areas CA and widths of the transfer areas CA may be designed by considering the sizes of the first and second signal pads PD1 and PD2, distances between the first signal pads PD1, and/or distances between the second signal pads PD2.

The photoresist PR may be transferred (or coated) in transfer areas CA of the silicon mold SM when the photoresist PR is picked up by the silicon mold SM from a predetermined pad image plate.

The transfer areas CA may protrude with respect to the peripheral areas PA.

Referring to FIG. 9B, the silicon mold SM may be disposed to face the side of the substrate SUB, a pad printing process may be performed to pressurize the silicon mold SM against the top, side, and bottom of edge area EA of the substrate SUB. Accordingly, as shown in FIG. 9A, a pattern PRP (including photoresist members) can be attached onto the conductive layer CDL.

In the pad printing process, the photoresist pattern PRP may be printed (or attached) within the range of the conductive layer CDL. Thus, the photoresist pattern PRP cannot interfere with the light emitting element pad LPD.

Subsequently, the photoresist pattern PRP formed on the substrate SUB may be pre-cured. The photoresist pattern PRP may be cured at a temperature of about 120° C. for about three minutes. Accordingly, the photoresist pattern PRP can be relatively firmly attached to the conductive layer CDL and can maintain desirable shapes.

Subsequently, referring to FIGS. 9A, 10A, and 10B, the signal line SGL covered by the photoresist pattern PRP may be formed by etching portions of the conductive layer CDL that are exposed by the photoresist pattern PRP (in the step S500). The photoresist pattern PRP may serve as a patterning mask. FIG. 10B illustrates a cross-sectional view of a portion AA indicated in FIG. 10A.

The signal line SGL may be formed through a wet etching process performed on the conductive layer CDL. In the wet etching process (using a chemical reaction), etching is isotropically performed, and therefore, the conductive layer CDL may be undercut with respect to the photoresist pattern PRP. Referring to FIG. 10B, the conductive layer CDL may be undercut under the photoresist pattern PRP, and an end portion (or edge) of the signal line SGL may be located farther from the nearest edge of the substrate SUB than an end portion (or edge) of the photoresist pattern PRP (which may be spaced from the substrate SUB). Accordingly, as shown in FIG. 10A, a length and a width of the signal line SGL may be smaller than a length and a width of the photoresist pattern PRP.

Referring to FIG. 10B, after the etching of the conductive layer CDL, a signal line SGL may completely cover edges and one or more faces of a corresponding first signal pad PD1. Each of the signal line SGL and the first signal pad PD1 may have a tapered portion toward an edge.

Subsequently, end portions (or edges) of the signal line SGL, the first signal pad PD1, and the second signal pad PD2 may be capped (or covered) by curing the photoresist pattern PRP at a high temperature (in the step S600). The photoresist pattern PRP may be cured at a temperature of about 200° C. for about 30 minutes to form a cured photoresist pattern ISP, i.e., the insulating pattern ISP.

Referring to FIG. 10B and FIG. 11, the photoresist pattern PRP may be reflowed in the process of curing the photoresist pattern PRP at the high temperature to directly contact and cover end portions (and sides/edges) of the signal line SGL, wherein the signal line SGL covers the corresponding first signal pad PD1. The reflowed photoresist pattern PRP (and the cured photoresist pattern ISP) may directly contact the substrate SUB. Advantageously, the cured photoresist pattern ISP may securely cover the signal line SGL. A separate stripping process of the photoresist pattern PRP may be unnecessary.

A portion of the cured photoresist pattern ISP covers an edge of the signal line SGL. A distance D between an edge of the portion of the signal line SGL and the edge of the cured photoresist pattern ISP may be 2 μm or more and 10 μm or less. That is, sides of the signal line SGL can be sufficiently covered after the reflow of the photoresist pattern PRP. Black photoresist members of the cured photoresist pattern ISP may be spaced from each other in the second direction DR2 and may sufficiently cover the signal lines SGL arranged at the side of the substrate SUB.

In accordance with embodiments, side conductive lines and a coating-insulating structure may be formed by transferring a black photoresist pattern through a pad printing process, etching portions of an underlying conductive layer that are exposed by the photoresist pattern, and then reflowing the photoresist pattern. Accordingly, the manufacturing process of display panels included in a tiled display device can be simplified, and the side conductive lines can be covered. Advantageously, a process yield of display panels can be maximized, and manufacturing cost of display devices can be saved.

Example embodiments have been described. Features described in connection with a particular embodiment may be used singly or in combination with features described in connection with other embodiments unless otherwise specifically indicated. Various changes in form and details may be made to the example embodiments without departing from the scope set forth in the following claims.

What is claimed is:

1. A method of manufacturing a display panel, the method comprising:
   providing a first signal pad on a first face of a substrate;
   providing a second signal pad on a second face of the substrate;
   providing a conductive member that contacts each of the first signal pad, the second signal pad, and a third face of the substrate;
   providing a photoresist member that partially covers the conductive member and overlaps each of the first signal pad, the second signal pad, and the third face of the substrate;
   pre-curing the photoresist member;
   forming a signal line by etching the conductive member; and
   curing the photoresist member to form a cured photoresist member, wherein in cured photoresist member covers an edge of the signal line.

2. The method of claim 1, wherein the first signal pad and the second signal pad are positioned between two sections of the conductive member and respectively directly contact the two sections of the conductive member.

3. The method of claim 2, wherein the photoresist member completely covers each of a face of the signal line, a face of the first signal pad, and a face of the second signal pad, and wherein the face of the signal line overlaps the third face of the substrate.

4. The method of claim 3, wherein the photoresist member includes a photoresist and a black pigment.

5. The method of claim 4, wherein the black pigment includes at least one of carbon black and titanium black.

6. The method of claim 1, wherein, in the forming of the signal line, the conductive member is wet-etched to be undercut with respect to the photoresist member.

7. The method of claim 1, wherein the conductive member is integrally formed on the first face of the substrate, the second face of the substrate, and the third face of the substrate through a sputtering process.

8. The method of claim 7, wherein the conductive member includes at least one of copper and titanium.

9. The method of claim 1, wherein the providing of the photoresist member comprises:
providing a photoresist in a silicon mold; and
transferring the photoresist from the silicon mode onto the first face of the substrate, the second face of the substrate, and the third face of the substrate through a printing process.

10. The method of claim 9, wherein the silicon mold includes a groove, wherein the photoresist is provided inside the groove before being transferred onto the substrate, and wherein a position of the photoresist member corresponds to a position of the groove in the printing process.

11. The method of claim 1, wherein the photoresist member is reflowed by the curing, and wherein the cured photoresist member directly contacts the substrate.

12. The method of claim 1, wherein both of the edge of the signal line and an edge of the cured photoresist member directly contact the substrate, and wherein a distance between the edge of the signal line and the edge of the photoresist is 2 μm or more and 10 μm or less.

13. A display panel comprising:
a substrate;
a pixel disposed on a first face of the substrate;
a first signal pad disposed on the first face of the substrate, disposed between the pixel and an edge of the first face of the substrate, and electrically connected to the pixel;
a second signal pad disposed on a second face of the substrate;
a signal line disposed on at least a third face of the substrate and electrically connecting the first signal pad and the second signal pad to each other; and
an insulating member covering each of a face of the signal line, a face of the first signal pad, and a face of the second signal pad.

14. The display panel of claim 13, wherein the insulating member includes a photoresist material and a black pigment.

15. The display panel of claim 14, wherein the black pigment includes at least one of carbon black and titanium black.

16. The display panel of claim 14, wherein the first signal pad and the second signal pad are disposed between two sections of the signal line, and wherein the two sections of the signal line are disposed between two sections of the insulating member.

17. The display panel of claim 14, wherein the insulating member directly contacts each of the signal line and the substrate.

18. A tiled display device comprising:
a first display panel and a second display panel neighboring each other,
wherein the first display panel comprises:
a substrate;
a pixel disposed on a first face of the substrate;
a first signal pad disposed on the first face of the substrate, disposed between the pixel and an edge of the first face of the substrate, and electrically connected to the pixel;
a second signal pad disposed on a second face of the substrate;
a signal line disposed on at least a third face of the substrate, at least partially disposed between the third face of the substrate and the second display panel, and electrically connecting the first signal pad and the second signal pad to each other; and
an insulating member at least partially disposed between the signal line and the second display panel and covering each of a face of the signal line, a face of the first signal pads, and a face of the second signal pad.

19. The tiled display device of claim 18, wherein the insulating member includes a photoresist material and a black pigment.

20. The tiled display device of claim 19, wherein the insulating member directly contacts each of the signal line and the substrate and directly contacts at least one of the first signal pad and the second signal pad.

* * * * *